(12) United States Patent
Shimizu

(10) Patent No.: US 6,335,885 B1
(45) Date of Patent: Jan. 1, 2002

(54) SEMICONDUCTOR DEVICE HAVING A DELAY CIRCUIT FOR ADJUSTING THE TIMING OF CONTROL SIGNALS

(75) Inventor: Tadayuki Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/799,685

(22) Filed: Mar. 7, 2001

(30) Foreign Application Priority Data

Sep. 22, 2000 (JP) .......................................... 12-288225

(51) Int. Cl.[7] .............................. G11C 7/20; G11C 7/08
(52) U.S. Cl. ...................... 365/194; 365/196; 365/226; 365/233.5; 365/202; 365/63
(58) Field of Search .................................. 365/194, 226, 365/189.09, 233.5, 202, 196, 195, 189.05, 63

(56) References Cited

U.S. PATENT DOCUMENTS 5,991,228 A * 11/1999 Pyeon .................... 365/230.08

FOREIGN PATENT DOCUMENTS

JP 9-200014 7/1997 .......... H03K/17/00

* cited by examiner

*Primary Examiner*—Andrew Q. Tran
(74) *Attorney, Agent, or Firm*—McDermott, Will & Emery

(57) ABSTRACT

A semiconductor device comprising: a power source voltage detecting member for outputting a voltage detection signal in accordance with a power source voltage; and a delay member which includes an input portion for receiving an input signal, a plurality of delay portions connected to the input portion, a selective portion for selecting one of the delay portions in accordance with the voltage detection signal and an output portion for outputting a delay signal obtained by delaying the input signal by the one of the delay portions.

20 Claims, 15 Drawing Sheets

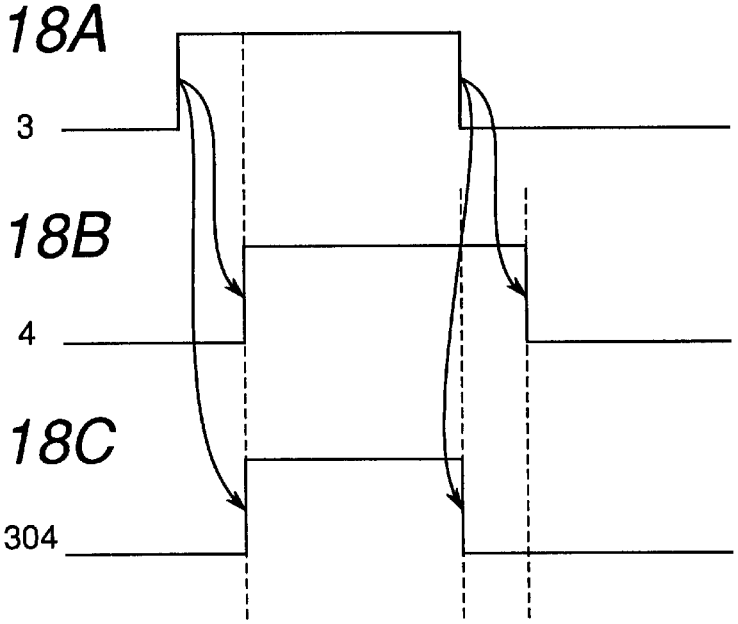
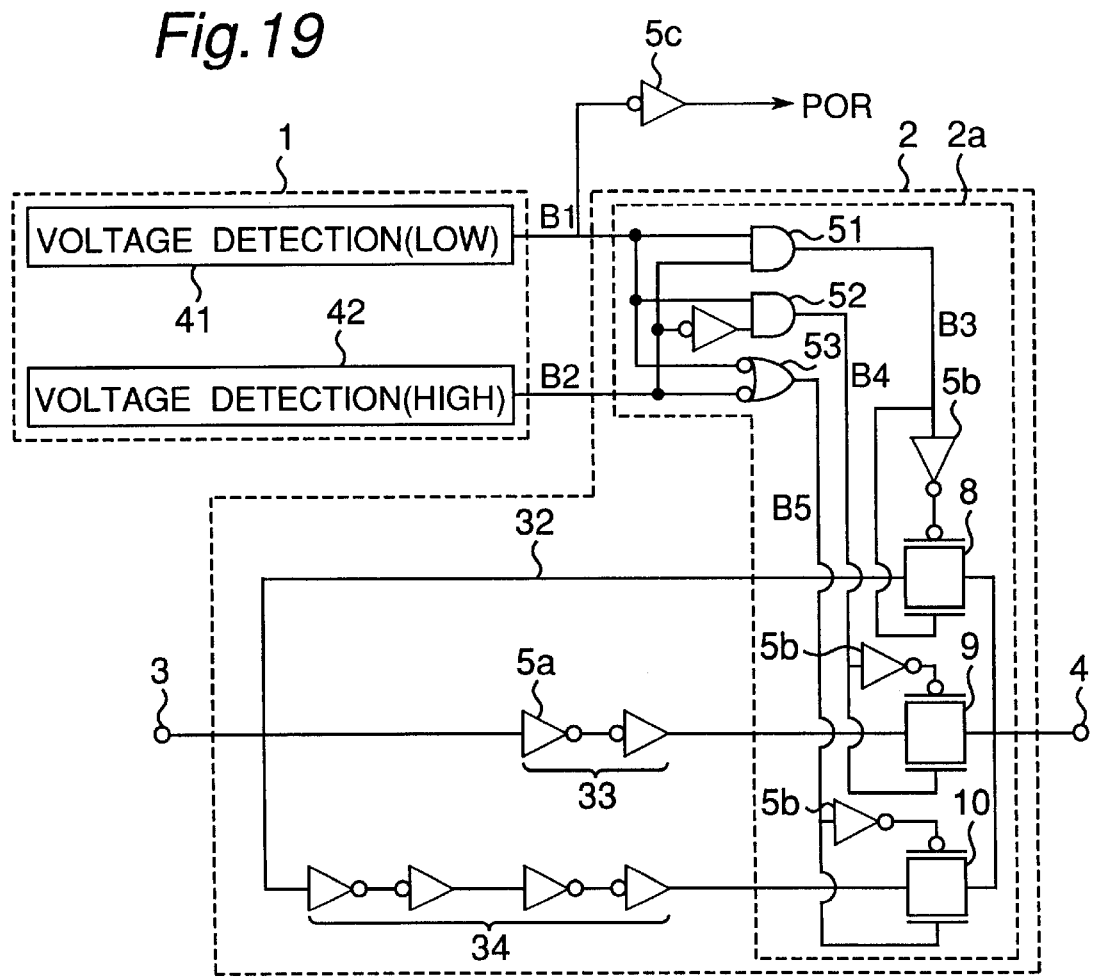

SEMICONDUCTOR DEVICE HAVING A DELAY CIRCUIT FOR ADJUSTING THE TIMING OF CONTROL SIGNALS

BACKGROUND OF THE INVENTION

1. Field of the Invention

The present invention relates to a semiconductor device including a delay circuit.

2. Description of the Prior Art

In the semiconductor device, timing adjustment of signals for controlling circuit operation is usually performed by using the delay circuit.

For example, as shown in FIG. 24, a conventional delay circuit includes an input portion 3 for receiving a signal, a first delay portion 6 formed by two inverters 5a, a first output portion 4a for outputting a first delay signal produced by the first delay portion 6, a second delay portion 7 connected to the input portion 3 in parallel with the first delay portion 6 and formed by four inverters 5a, a second output portion 4b for outputting a second output signal produced by the second delay portion 7, a first metallic line ME1 for connecting the first output portion 4a and an output portion 4 for outputting a delay signal of the delay circuit and a second metallic line ME2 for connecting the second output portion 4b and the output portion 4. Only one of the first and second metallic lines ME1 and ME2 is used actually through its selection during production of the semiconductor device. In this conventional delay circuit, since the number of the inverters 5a used for the second delay portion 7 is larger than that of the first delay portion 6, delay amount of the signal on the second metallic line ME2 is larger than that of the first metallic line ME1.

Conventionally, since delay amount of the delay circuit is switched by the metallic lines or the like, it has been impossible to change the delay amount after production of the semiconductor device unless a fuse or the like is formed.

On the other hand, due to recent trend towards low-voltage operation, there is a keen demand for a semiconductor device which is usually operated at, for example, 3V but can be operated also at 2V. However, low voltage operation is prevented by such a cause as dependence of the delay circuit on voltage, thereby resulting in improper operational timing. Therefore, if delay amount is adjusted by the metallic lines as described above, it is difficult to operate the semiconductor device at voltages ranging from ordinary voltage to low voltage.

SUMMARY OF THE INVENTION

Accordingly, an essential object of the present invention is to provide, with a view to eliminating the above mentioned drawbacks of prior art semiconductor devices, a semiconductor device which is capable of generating, even if power source voltage changes, a delay signal corresponding to the power source voltage.

In order to accomplish this object of the present invention, a semiconductor device according to the present invention comprises: a power source voltage detecting means for outputting a voltage detection signal in accordance with a power source voltage; and a delay means which includes an input portion for receiving an input signal, a plurality of delay portions connected to the input portion, a selective portion for selecting one of the delay portions in accordance with the voltage detection signal and an output portion for outputting a delay signal obtained by delaying the input signal by the one of the delay portions.

BRIEF DESCRIPTION OF THE DRAWINGS

This object and features of the present invention will become apparent from the following description taken in conjunction with the preferred embodiments thereof with reference to the accompanying drawings in which:

FIGS. 18A to 18C are views showing operating wave forms of the delay means of FIGS. 14 and 15;

FIG. 19 is a circuit diagram of a power source voltage detecting means and a delay means according to a seventh embodiment of the present invention;

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
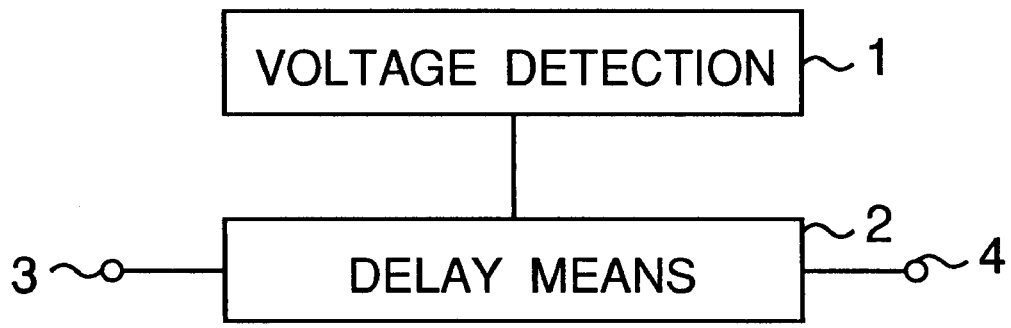
FIG. 1 is a circuit diagram of a delay circuit according to a first embodiment of the present invention.

FIG. 1 shows a delay circuit according to a first embodiment of the present invention. The delay circuit includes a power source voltage detecting means 1 for detecting a power source voltage so as to output a voltage detection signal and a delay means 2 for selecting a delay amount of a signal. The delay means 2 includes an input portion 3 for receiving input signals such as a control signal, a data signal, a selection signal, etc. which are used for operating a semiconductor device and an output portion 4 for delaying the input signals through a predetermined amount so as to output delay signals.

Figure 2:
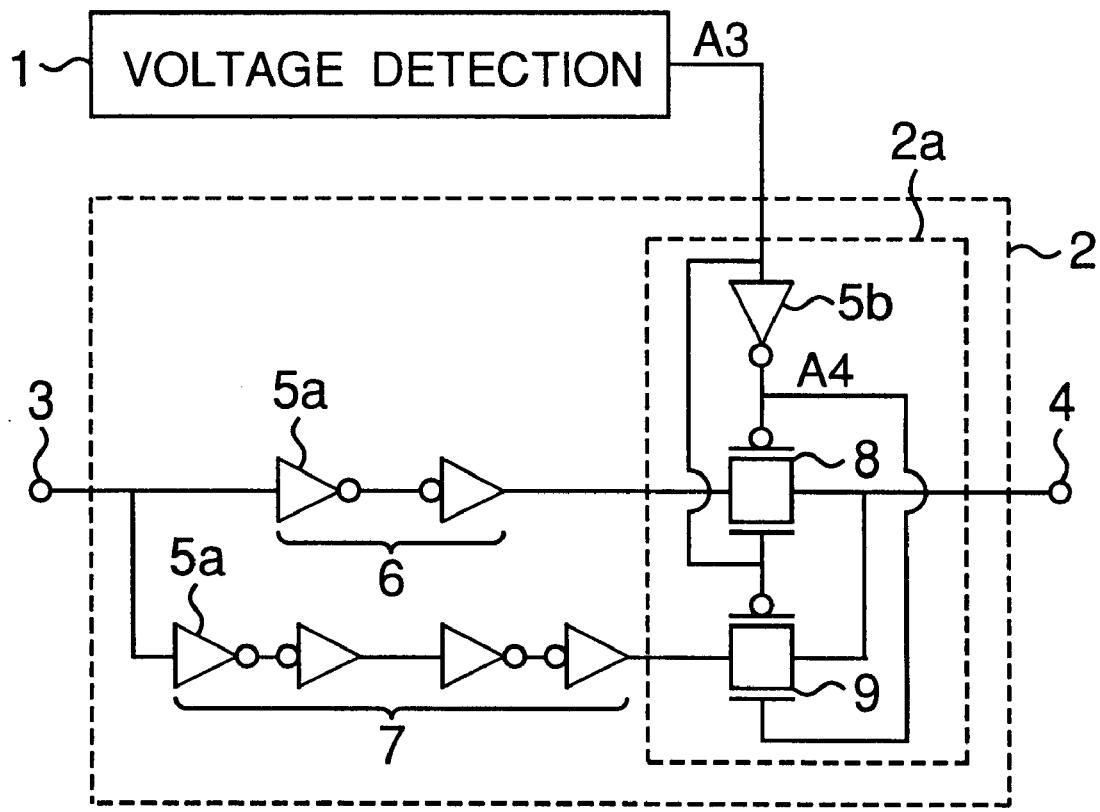
FIG. 2 is a circuit diagram of a delay means employed in the delay circuit of FIG. 1.

Then, a concrete circuit configuration of the delay means 2 in FIG. 1 is shown in FIG. 2. In FIG. 2, the delay means 2 includes a first delay portion 6 having two inverters 5a connected to each other in series, a second delay portion 7 having four inverters 5a connected to one another in series, a first transfer gate 8 connected to the first delay portion 6 and a second transfer gate 9 connected to the second delay portion 7. In each of the first and second transfer gates 8 and 9, a PMOS transistor and an NMOS transistor are connected to each other in parallel. The first transfer gate 8 has opposite conductive ends connected to the first delay portion 6 and the output portion 4 of the delay means 2, which are referred to an "input end" and an "output end" of the first transfer gate 8, respectively. Likewise, the second transfer gate 9 has opposite conductive ends connected to the second delay portion 7 and the output portion 4 of the delay means 2, which are referred to an "input end" and an "output end" of the second transfer gate 9, respectively.

The voltage detection signal and an inversion signal into which the voltage detection signal is inverted by an inverter 5b are, respectively, inputted from nodes 3A and 4A to gates of each of the first and second transfer gates 8 and 9, which gates act as control ends of each of the first and second transfer gates 8 and 9. The first and second transfer gates 8 and 9 are connected to each other such that logical signals inputted to the gates of the first transfer gate 8 are complementary to those inputted to the corresponding gates of the second transfer gate 9, respectively.

By the above described arrangement of the delay means 2, output ends of the first and second delay portions 6 and 7 are selectively connected to the output portion 4 of the delay means 2 via the first and second transfer gates 8 and 9. Meanwhile, a selective portion 2a for selecting the first and second delay portions 6 and 7 is constituted by the first and second transfer gates 8 and 9 and the inverter 5b.

Figure 3:
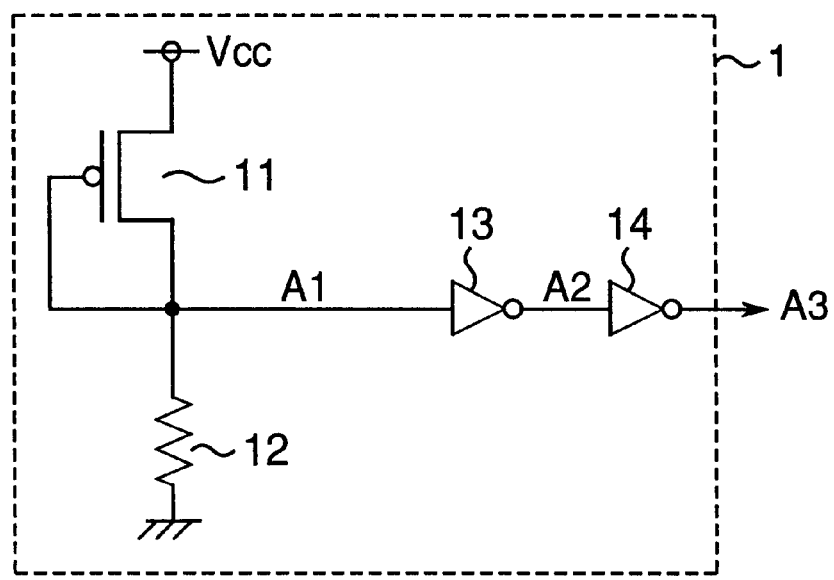
FIG. 3 is a circuit diagram of a power source voltage detecting means employed in the delay circuit of FIG. 1.

Then, a concrete circuit configuration of the power source voltage detecting means 1 in FIGS. 1 and 2 is shown in FIG. 3. A source of a PMOS transistor 11 is connected to a power source voltage line having a voltage Vcc, while a drain and a gate of the PMOS transistor 11 are connected to a junction in common. One end of a resistance 12 is connected to the junction of the drain and the gate of the PMOS transistor 11, while the other end of the resistance 12 is connected to a grounding conductor. An input end of an inverter 13 is connected to the junction of the resistance 12 and the drain and the gate of the PMOS transistor 11 and an output end of the inverter 13 is connected to an input end of an inverter 14. An output end of the inverter 13 is connected to an output node A3 of the power source voltage detecting means 1.

Figure 4:
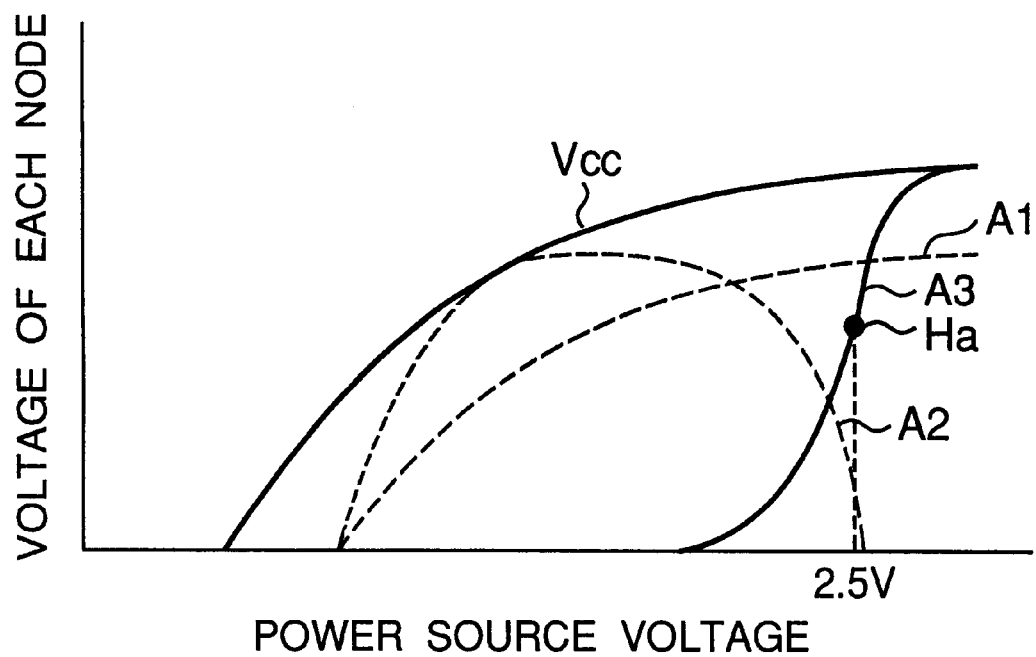
FIG. 4 is a graph showing voltage characteristics of the power source voltage detecting means of FIG. 3.

Then, operation of the power source voltage detecting means 1 shown in FIG. 3 is described. FIG. 4 shows relation between the power source voltage and respective voltages of nodes A1, A2 and A3 of the power source voltage detecting means 1. In FIG. 4, the voltage Vcc of the power source voltage line rises in accordance with rise of the power source voltage. With an offset from the voltage Vcc of the power source voltage line, the voltage of the node A1 rises substantially in proportion to the voltage Vcc of the power source voltage line. When the voltage of the node A1 reaches a predetermined value or more, an inverted signal of the inverter 13 appears at the node A2 so as to exhibit a high level. However, if the power source voltage rises further, the voltage of the node A1 assumes a high level and the voltage of the node A2 assumes a low level. In response to this, the voltage of the node A3 rises to a high level. Namely, the node A1 acts as a voltage detecting portion and a voltage detection signal is generated at the node A3 through the inverters 13 and 14. Since a voltage detecting member is formed by the PMOS transistor 11 and the resistance 12, the power source voltage detecting means 1 can be made compact.

Then, assuming that the power source voltage at a point where the voltage of the node A3 in FIG. 4 changes, namely, the power source voltage at a point Ha in FIG. 4 is 2.5V, operation of the delay means 2 shown in FIG. 2 is described for cases where the power source voltage is lower and higher than 2.5V. Initially, in case the power source voltage is 2V, the voltage of the node A3, namely, the voltage detection signal of the power source voltage detecting means 1 assumes a low level. In response to this, a voltage of the node A4 in FIG. 2 assumes a high level, so that the first transfer gate 8 is in nonconductive state and the second transfer gate 9 is in conductive state. Therefore, an input signal applied to the input portion 3 is delivered through the second delay portion 7 and the second transfer gate 9 so as to be outputted, as a delay signal, to the output portion 4.

Subsequently, in case the power source voltage is 3V, the voltage of the node A3, i.e., the voltage of the output node A3 of the power source voltage detecting means 1 assumes a high level as will be seen from FIG. 4. In response to this, the voltage of the node A4 in FIG. 2 assumes a low level. Thus, the first transfer gate 8 is in conductive state and the second transfer gate 9 is in nonconductive state. Therefore, an input signal applied to the input portion 3 is transmitted through the first delay portion 6 and the first transfer gate 8 so as to be outputted, as a delay signal, to the output portion 4.

Since the delay means 2 of the above described arrangement performs changeover of the first and second delay portions 6 and 7 automatically on the basis of the power source voltage, the delay amount can be adjusted even after manufacture of the semiconductor device.

Meanwhile, it may be considered that position of the first and second transfer gates 8 and 9 is replaced by that of the first and second delay portions 6 and 7, namely, the input end of each of the first and second transfer gates 8 and 9 is connected to the input portion 3 of the delay means 2 and the output end of each of the first and second transfer gates 8 and 9 is connected to each of the first and second delay portions 6 and 7. However, when the first transfer gate 8 or the second transfer gate 9 is in nonconductive state, voltage of the output end of the nonconductive one of the first and second transfer gates 8 and 9 becomes indeterminate, so that there is a possibility that a voltage intermediate between the power source voltage and a ground voltage is applied to the inverters 5a of the corresponding one of the first and second delay portions 6 and 7 such that short circuit current flows therethrough.

On the other hand, in this embodiment of the present invention, since each of the first and second transfer gates 8 and 9 is provided between each of the first and second delay portions 6 and 7 and the output portion 4 of the delay means 2, the input signal applied to the input portion 3 goes to the first and second delay portions 6 and 7 and thus, an input to the inverters 5a does not become indeterminate. Furthermore, even if one of the first and second transfer gates 8 and 9 is in nonconductive state, the other of the first and second transfer gates 8 and 9 is in conductive state, so that voltage of the output portion 4 of the delay means 2 does not become indeterminate and thus, short circuit current does not flow even when an inverter is provided downstream of the output portion 4.

(Second Embodiment)

Figure 5:
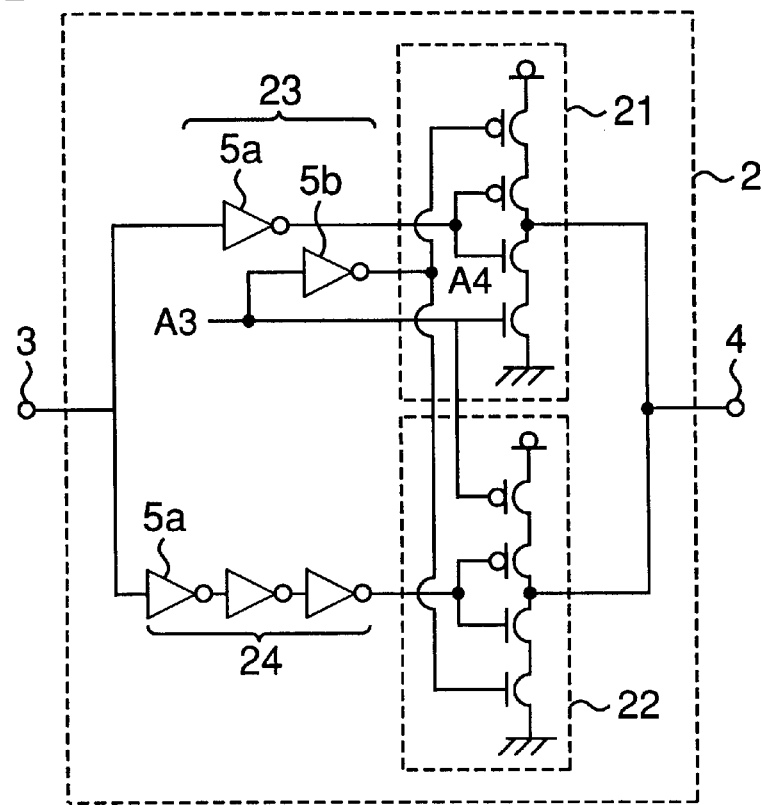
FIG. 5 is a circuit diagram of a delay means according to a second embodiment of the present invention.

FIG. 5 shows a circuit of a delay means 2 according to a second embodiment of the present invention, in which first and second clocked inverters 21 and 22 are employed in place of the first and second transfer gates 8 and 9 of the selective portion 2a of FIG. 2. Furthermore, a first delay portion 23 connected to the first clocked inverter 21 is formed by one inverter 5a, while a second delay portion 24 connected to the second clocked inverter 22 are formed by three inverters 5a connected to one another in series. Gates of each of the first and second clocked inverters 21 and 22, which perform switch control function, are connected to the nodes A3 and A4 of FIG. 2.

Then, operation of the delay means 2 of FIG. 5 is described. It is supposed here that the power source voltage at the point Ha in FIG. 4 is 2.5V in the same manner as the first embodiment of the present invention. In case the power source voltage is 2V, an input signal applied to the input portion 3 is delivered through the second delay portion 24 and the second clocked inverter 22 so as to be outputted, as a delay signal, to the output portion 4. Meanwhile, in case the power source voltage is 3V, an input signal applied to the input portion 3 is transmitted through the first delay portion 23 and the first clocked inverter 21 so as to be outputted, as a delay signal, to the output portion 4.

In the arrangement in which the inverters 5a and the transfer gate 8 or 9 are provided as in the first embodiment of the present invention, setting of delay amounts of the inverters 5a and the transfer gate 8 or 9 is inclined to become complicated because delay amount of the transfer gate 8 or 9 is generally different from that of the inverters 5a. On the contrary, in this embodiment of the present invention, since the delay portions 23 and 24 are formed by the inverters 5a and the selective portion 2a is also formed by the clocked inverters 21 and 22, the inverters 5a and the clocked inverters 21 and 22, both of which have inverter function, have similar delay amounts, so that setting of the delay amounts of the inverters 5a and the clocked inverters 21 and 22 is facilitated.

(Third Embodiment)

Figure 6:
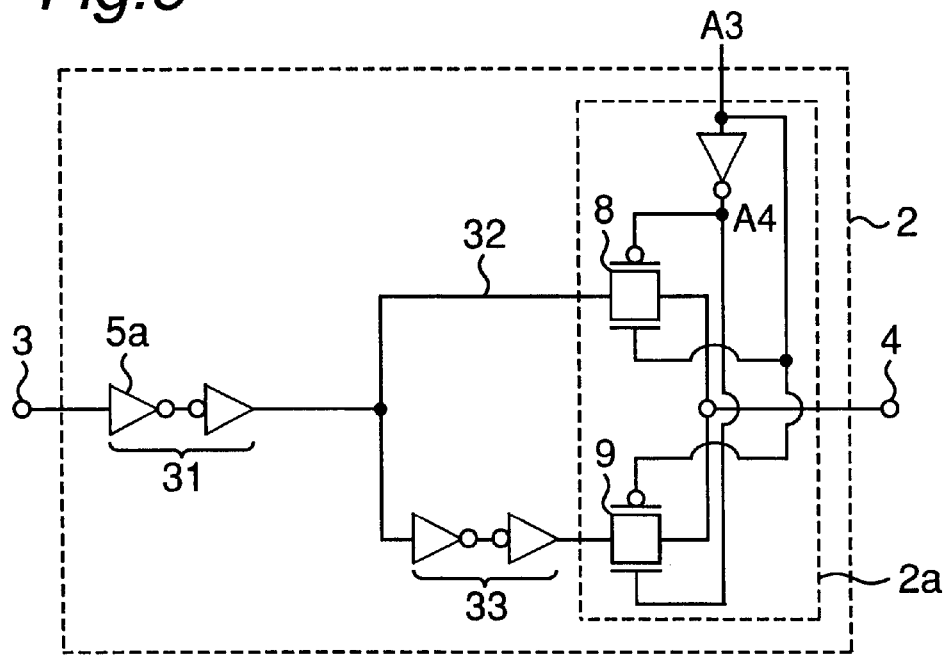
FIG. 6 is a circuit diagram of a delay means according to a third embodiment of the present invention.

FIG. 6 shows a delay means 2 according to a third embodiment of the present invention, in which a common delay portion 31 is connected to two delay portions in series, i.e., a metallic line 32 and a delay portion 33 connected to each other in parallel. The common delay portion 31 is formed by two inverters 5a connected to each other in series, while the delay portion 33 is also formed by two inverters 5a connected to each other in series. The metallic line 32 is connected to the first transfer gate 8, while the delay portion 33 is connected to the second transfer gate 9. Delay amount of the metallic line 32 depends on its length but is negligibly small in comparison with those of delay elements such as an inverter, a polycrystalline silicon resistance and a gate capacitance when the metallic line 32 is used for an ordinary delay circuit. However, in this embodiment of the present invention, the metallic line 32 acts as the delay portion.

In case the power source voltage is 2V under the same conditions as the first embodiment of the present invention, an input signal applied to the input portion 3 is delivered through the common delay portion 31, the delay portion 33 and the second transfer gate 9 so as to be outputted, as a delay signal corresponding to the input signal, to the output portion 4. Meanwhile, in case the power source voltage is 3V, an input signal applied to the input portion 3 is transmitted through the common delay portion 31, the metallic line 32 and the first transfer gate 8 so as to be outputted, as a delay signal corresponding to the input signal, to the output portion 4.

In this embodiment of the present invention, since the common delay portion 31 is provided, delay amounts corresponding to the four inverters 5a in the case of the power source voltage of 2V and the two inverters 5a in the case of the power source voltage of 3V are obtained as in FIG. 2 but a sum of the inverters 5a is reduced to four from six of FIG. 2, so that the delay means 2 can be made more compact.

Meanwhile, since the delay amount of the metallic line 32 acting as the delay portion is negligibly small as compared with those of the delay elements as described above, the metallic line 32 is suitable for making fine adjustment of delay amount of the delay means 2.

Furthermore, since the delay means 2 has a simple configuration, the delay amount of the delay means 2 can be set easily. Meanwhile, if the metallic line 32 is used as a resistance element by changing material of the metallic line 32, the metallic line 32 can serve as a delay portion having a larger delay amount.

In addition, in FIG. 6, the common delay portion 31 is connected to the input portion 3 but may also be connected between an output end of each of the first and second transfer gates 8 and 9 and the output portion 4 by shifting the common delay portion 31 to a location disposed between the output end of each of the first and second transfer gates 8 and 9 and the output portion 4.

(Fourth Embodiment)

Figure 7:
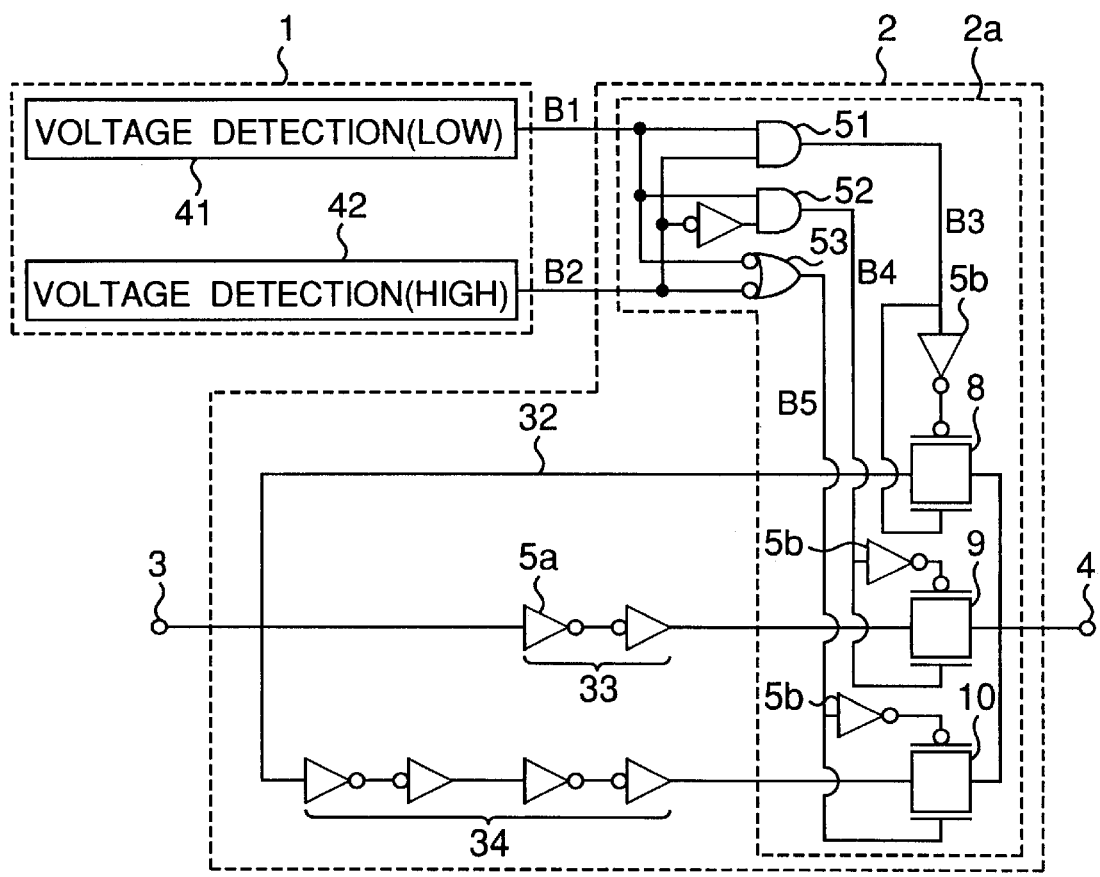
FIG. 7 is a circuit diagram of a power source voltage detecting means and a delay means according to a fourth embodiment of the present invention.

FIG. 7 shows a power source voltage detecting means 1 and a delay means 2 according to a fourth embodiment of the present invention, in which changeover of three delay portions, i.e., the metallic line 32, the delay portion 33 and a further delay portion 34 is performed in accordance with three kinds of the power source voltages. In FIG. 7, the power source detecting means 1 includes first and second power source voltage detecting circuits 41 and 42 each having such a configuration as shown in FIG. 3. The first power source voltage detecting circuit 41 is adapted to output a detection signal to a node B1 at a low power source voltage, while the second power source voltage detecting circuit 42 is adapted to output a detection signal to a node B2 at a power source voltage higher than that of the first power source voltage detecting circuit 41.

In the delay means 2, AND gates 51 and 52 and a NOR gate 53 are formed so as to receive a voltage detection signal from the power source voltage detecting means 1 and output respective output signals to nodes B3, B4 and B5. Meanwhile, the first transfer gate 8, the second transfer gate 9 and a third transfer gate 10 are formed so as to correspond to the metallic line 32, the delay portion 33 and the further delay portion 34, respectively. An output signal and its inversion signal of each of the logical gates 51, 52 and 53 are inputted to gates of each of the first, second and third transfer gates 8, 9 and 10. The selective portion 2a is formed by the AND gates 51 and 52, the NOR gate 53, the first to third transfer gates 8–10 and the inverters 5b.

Then, operation of the power source voltage detecting means 1 and the delay means 2 is described. In FIG. 7, it is assumed here as a concrete example that the first power source voltage detecting circuit 41 outputs low-level and high-level voltage detection signals to the node B1 when the power source voltage is less than and not less than 1.8V, respectively, while the second power source voltage detecting circuit 42 outputs low-level and high-level voltage detection signals to the node B2 when the power source voltage is less than and not less than 2.5V, respectively.

Initially, when the power source voltage is 1.5V, both of the nodes B1 and B2 are at low level, so that only the node B5 in the nodes B3 to B5 is at high level. As a result, only the third transfer gate 10 in the first to third transfer gates 8 to 10 is in conductive state and thus, the further delay portion 34 is selected.

Then, when the power source voltage is 2.0V, the node B1 is at high level and the node B2 is at low level, so that only the node B4 in the nodes B3 to B5 is at high level. As a result, only the second transfer gate 9 in the first to third transfer gates 8 to 10 is in conductive state and thus, the delay portion 33 is selected.

Subsequently, when the power source voltage is 2.8V, both of the nodes B1 and B2 are at high level, so that only the node B3 in the nodes B3 to B5 is at high level. As a result, only the first transfer gate 8 in the first to third transfer gates 8 to 10 is in conductive state and thus, the metallic line 32 is selected.

In this embodiment of the present invention, the power source voltage detecting means 1 is arranged to output the detection signals at the three kinds of the power source voltages and the delay means 2 is capable of effecting changeover of the delay portions 32 to 34 in accordance with the respective detection signals. Therefore, since the delay portions 32 to 34 suitable for the respective power source voltages can be selected properly, delay amounts more suitable for the respective power source voltages can be selected.

Meanwhile, in this embodiment of the present invention, the three kinds of the power source voltages are handled but more than three kinds of the power source voltages also can be handled by increasing the number of each of the power source voltage detecting circuits 41 and 42, the logical gates 51 to 53 and the transfer gates 8 to 10 and arranging them properly.

(Fifth Embodiment)

Figure 8:
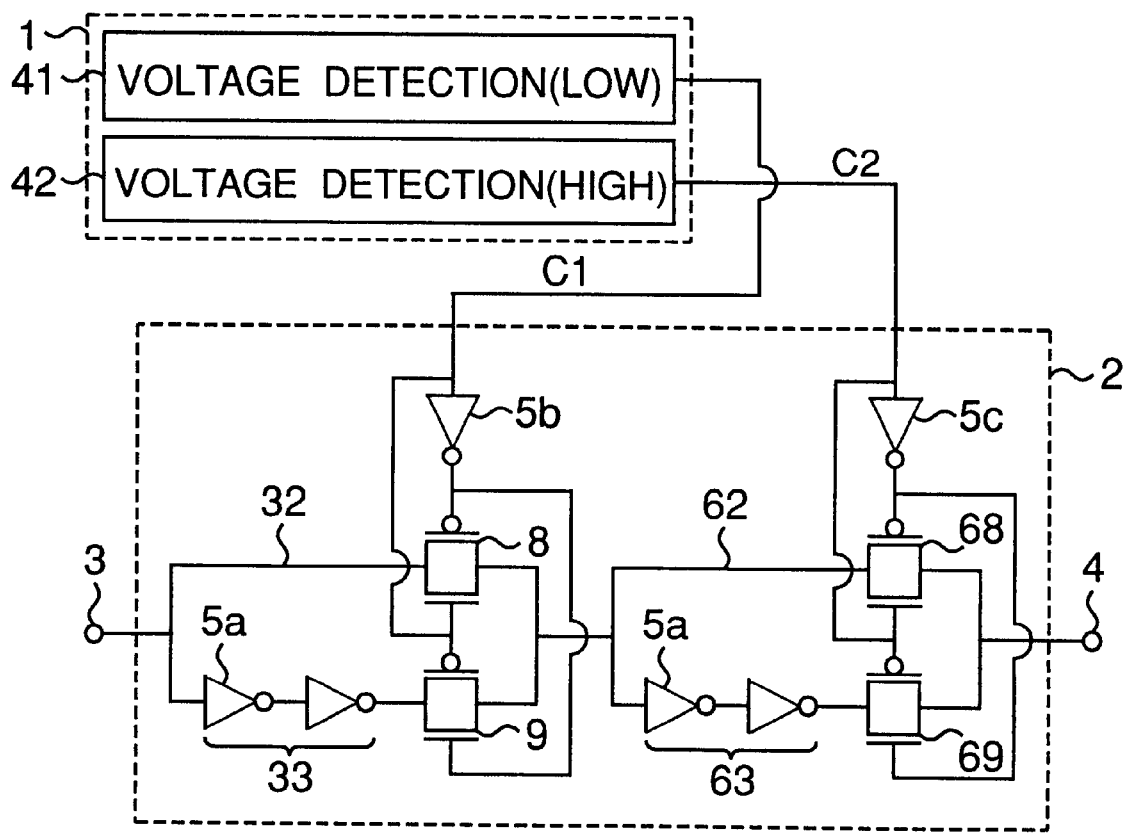
FIG. 8 is a circuit diagram of a power source voltage detecting means and a delay means according to a fifth embodiment of the present invention.

FIG. 8 shows a power source voltage detecting means 1 and a delay means 2 according to a fifth embodiment of the present invention, in which two internal circuits of the delay means 2 are connected to each other in series such that changeover of delay portions is performed in accordance with three kinds of the power source voltages. In FIG. 8, description of portions similar to those of FIG. 2 is abbreviated for the sake of brevity. In FIG. 8, a metallic line 62 is connected to a third transfer gate 68, while a still further delay portion 63 formed by two inverters 5*a* connected to each other in series is connected to a fourth transfer gate 69. Gates of each of the first and second transfer gates 8 and 9 are connected to an output node C1 of the first power source voltage detecting circuit 41 directly or through the inverter 5*b*, while gates of each of the third and fourth transfer gates 68 and 69 are connected to an output node C2 of the second power source voltage detecting circuit 42 directly or through an inverter 5*c*.

Then, operation of the power source voltage detecting means 1 and the delay means 2 is described. It is assumed here as a concrete example in the same manner as the fourth embodiment of the present invention that the first power source voltage detecting circuit 41 outputs low-level and high-level voltage detection signals to the node C1 when the power source voltage is less than and not less than 1.8V, respectively, while the second power source voltage detecting circuit 42 outputs low-level and high-level voltage detection signals to the node C2 when the power source voltages is less than and not less than 2.5V, respectively.

Initially, when the power source voltage is 1.5V, both of the nodes C1 and C2 are at low level, so that the second and fourth transfer gates 9 and 69 are in conductive state and thus, the delay portion 33 and the still further delay portion 63 are selected.

Then, when the power source voltage is 2.0V, the node C1 is at high level and the node C2 is at low level, so that the first and fourth transfer gates 8 and 69 are in conductive state and thus, the metallic line 32 and the still further delay portion 63 are selected.

Subsequently, when the power source voltage is 2.8V, both of the nodes C1 and C2 are at high level, so that the first and third transfer gates 8 and 68 are in conductive state and thus, the metallic lines 32 and 62 are selected.

By arranging the delay portions in series as described above, changeover of the delay portions can be performed in accordance with not less than three kinds of the power source voltages even if such a complicated logical circuit as the logical gates 51 to 53 of FIG. 7 is not formed.

(Sixth Embodiment)

Figure 9:
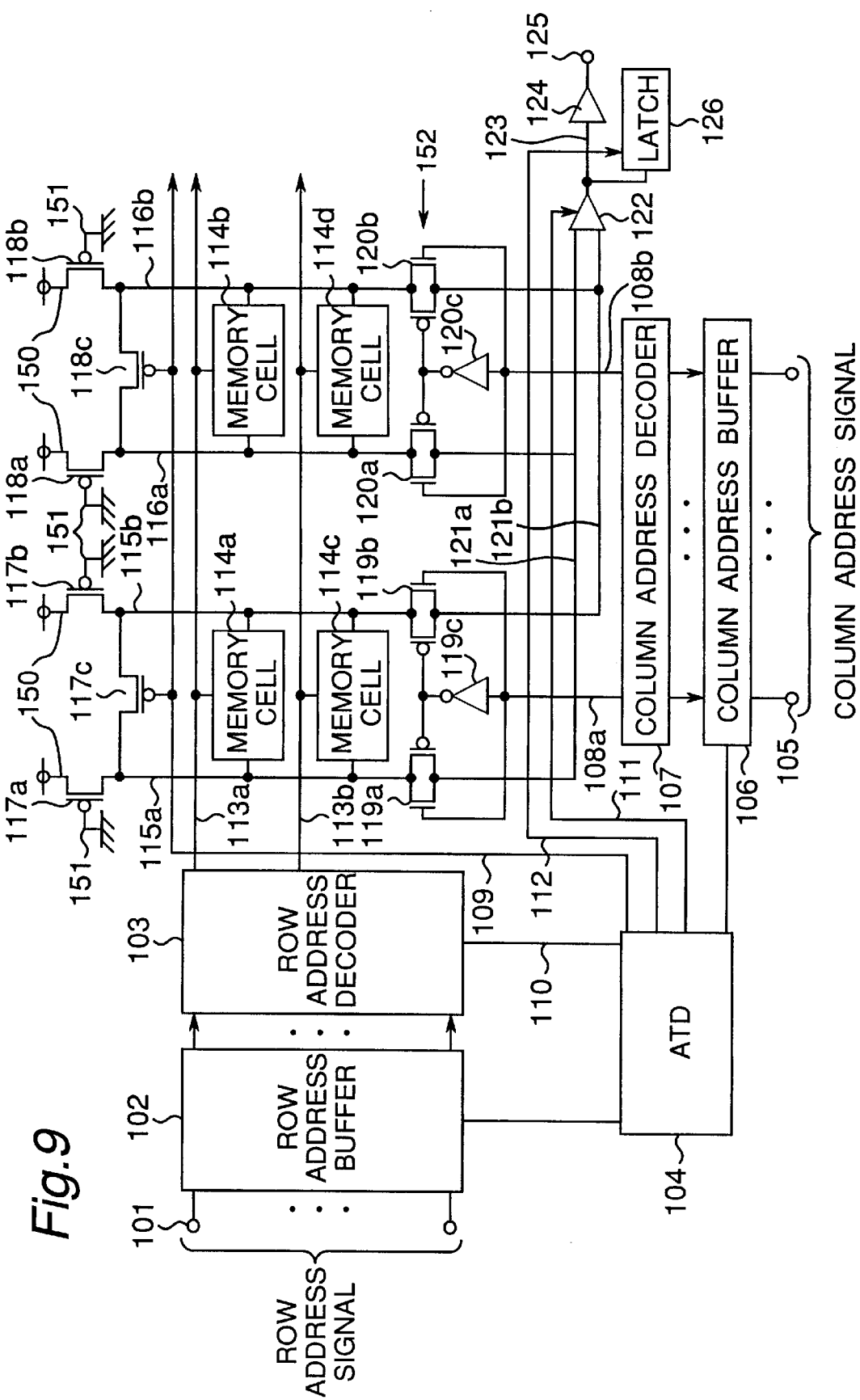
FIG. 9 is a diagram showing a configuration of an SRAM according to a sixth embodiment of the present invention.

FIGS. 9 to 18 show a sixth embodiment of the present invention in which a semiconductor device is applied to a semiconductor memory unit having a delay circuit, especially, a static random access memory (SRAM). FIG. 9 shows a configuration of the SRAM. In FIG. 9, the SRAM includes a plurality of memory cells arranged in directions of rows and columns, for example, four memory cells 114*a* to 114*d* for illustrative simplification, word lines 113*a* and 113*b* corresponding to each of the rows and complementary bit lines 115*a*, 115*b*, 116*a* and 116*b* corresponding to each of the columns.

As shown further in FIG. 9, an address selection circuit includes a row address buffer 102 and a row address decoder 103 which select one of the word lines 113*a* and 113*b* in accordance with a row address signal inputted to a row address input terminal 101 and a column address buffer 106 and a column address decoder 107 which select one of the bit lines 115*a*, 115*b*, 116*a* and 116*b* in accordance with a column address signal inputted to a column address input terminal 105. Meanwhile, in response to transition of the row address signal and the column address signal, a bit line equalizing signal for equalizing a potential of one of a pair of the bit lines to that of the other of the pair of the bit lines, a word line activating signal for setting the word lines 113*a* and 113*b* in selective state, a sense amplifier activating signal for causing a sense amplifier 122 to perform sense operation and a latch signal for latching data of a read data bus 123 are, respectively, produced in a bit line equalizing signal line 109, a word line activating signal line 110, a sense amplifier activating signal line 111 and a latch signal line 112 by an address transition detector (ATD) 104.

Furthermore, bit line loads 117*a*, 117*b*, 118*a* and 118*b* and bit line equalizers 117*c* and 118*c* are provided at one end of each of the bit lines 115*a*, 115*b*, 116*a* and 116*b*, while a column selecting gate 152 is provided at the other end of each of the bit lines 115*a*, 115*b*, 116*a* and 116*b*. Each of the bit line loads 117*a*, 117*b*, 118*a* and 118*b* is formed by a PMOS transistor which has a source connected to a power source voltage line 150, a drain connected to each of the bit lines 115*a*, 115*b*, 116*a* and 116*b* and a gate connected to a grounding conductor 151. The bit line equalizer 117*c* is formed by a PMOS transistor in which a source and a drain are connected between the bit lines 115a and 115b and a gate is connected to the bit line equalizing signal line 109. Likewise, the bit line equalizer 118c is formed by a PMOS transistor in which a source and a drain are connected between the bit lines 116a and 116b and a gate is connected to the bit line equalizing signal line 109.

In the column selecting gate 152, transfer gates 119a and 119b and an inverter 119c are provided for the bit lines 115a and 115b, while transfer gates 120a and 120b and an inverter 120c are provided for the bit lines 116a and 116b. One conductive end of each of the transfer gates 119a and 119b is connected to each of the bit lines 115a and 115b and the other conductive end of each of the transfer gates 119a and 119b is connected to each of I/O lines 121a and 121b. A gate of an NMOS transistor of each of the transfer gates 119a and 119b is connected to a column selecting line 108a for delivering a selection signal outputted from the column address decoder 107, while a gate of a PMOS transistor of each of the transfer gates 119a and 119b is connected to the column selecting line 108a via the inverter 119c. Similarly, one conductive end of each of the transfer gates 120a and 120b is connected to each of the bit lines 116a and 116b and the other conductive end of each of the transfer gates 120a and 120b is connected to each of the I/O lines 121a and 121b. A gate of an NMOS transistor of each of the transfer gates 120a and 120b is connected to a column selecting line 108b, while a gate of a PMOS transistor of each of the transfer gates 120a and 120b is connected to the column selecting line 108b through the inverter 120c.

Figure 10:
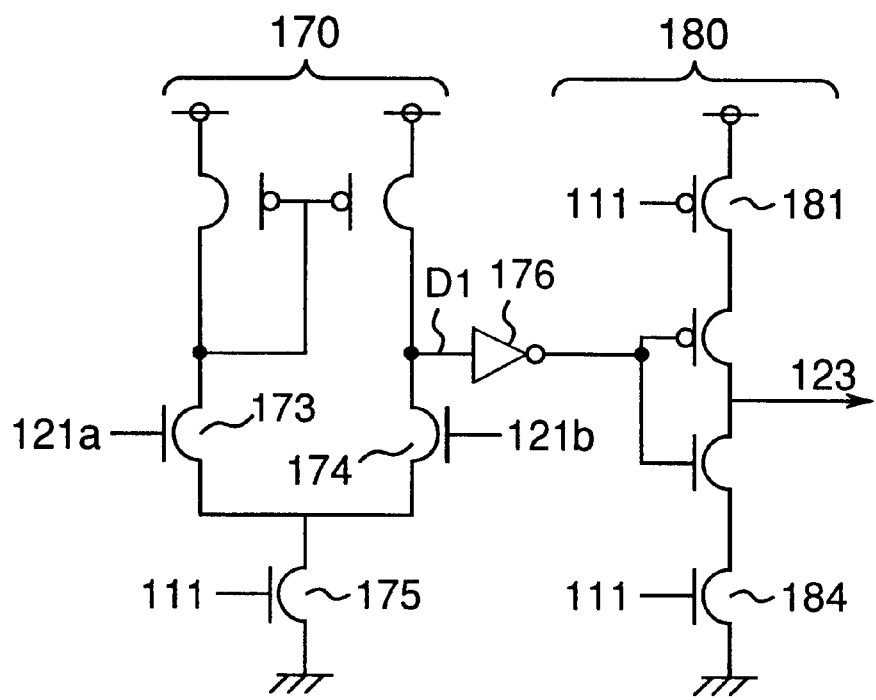
FIG. 10 is a circuit diagram of a sense amplifier employed in the SRAM of FIG. 9.

The SRAM further includes the sense amplifier 122, an output buffer 124 and an output latch 126. As shown in FIG. 10, the sense amplifier 122 includes an ordinary current mirror 170, an inverter 176 and a clocked inverter 180. The I/O lines 121a and 121b for transmitting an input signal of the sense amplifier 122 are, respectively, connected to gates of NMOS transistors 173 and 174 provided in the current mirror 170. An NMOS transistor 175 is provided for determining activation of the sense amplifier 122 and a gate of the NMOS transistor 175 is connected to the sense amplifier activating signal line 111. Meanwhile, the sense amplifier activating signal line 111 is also connected to gates of a PMOS transistor 181 and an NMOS transistor 184 provided in the clocked inverter 180. An output from the current mirror 170 is delivered to a node D1 so as to be applied to an input of the clocked inverter 180 by way of the inverter 176. An output of the clocked inverter 180 is connected to the read data bus 123.

Figure 11:
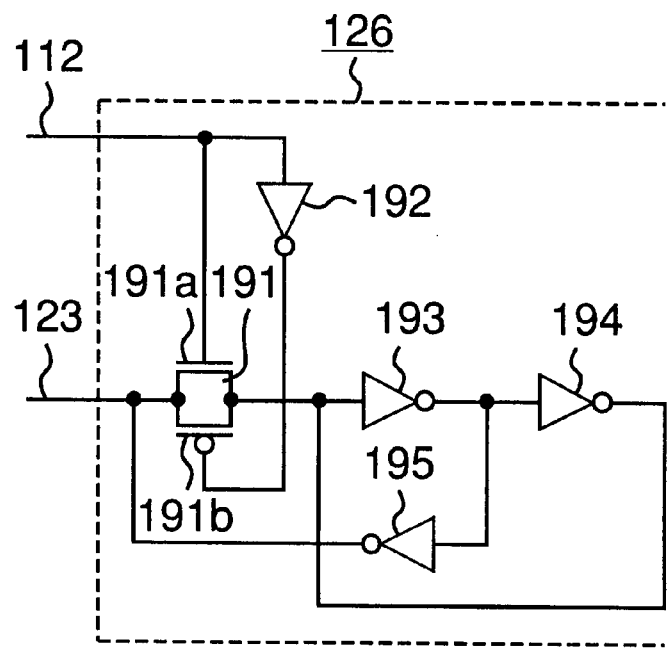
FIG. 11 is a circuit diagram of an output latch employed in the SRAM of FIG. 9.

Meanwhile, as shown in FIG. 11, the output latch 126 connected to the read data bus 123 includes a transfer gate 191 and inverters 192 to 195. The latch signal line 112 to which the latch signal is transmitted from the ATD 104 is connected to a gate of an NMOS transistor 191a of the transfer gate 191 and is connected to a gate of a PMOS transistor 191b of the transfer gate 191 via the inverter 192. One conductive end of the transfer gate 191 is connected to the read data bus 123, while the other conductive end of the transfer gate 191 is connected to the one conductive end of the transfer gate 191 through the inverters 193 and 195. Meanwhile, the inverter 194 is connected between an output end of the inverter 193 and the other conductive end of the transfer gate 191.

Then, a configuration of the ATD 104 shown in FIG. 9 is described with reference to FIG. 12. It is assumed here that an address signal from the row address buffer 102 and the column address buffer 106 is inputted to one of nodes AD1 to AD3. Each of the nodes AD1 to AD3 is connected to a local ATD 201 which generates a pulse signal when an input signal changes from high level to low level or from low level to high level. An output from the local ATD 201 is inputted to a NOR gate 202 and an output of the NOR gate 202 is connected to the bit line equalizing signal line 109 and an inverter 203. The inverter 203 is connected to a delay means 204 and the delay means 204 is, in turn, connected to a delay means 205 via two inverters. The delay means 205 is connected, through two inverters, to the sense amplifier activating signal line 111 and a delay means 206. The delay means 206 is connected to the latch signal line 112 by way of two inverters. The delay means 204 to 206 are connected to the power source voltage detecting means 1 in common.

Then, a configuration of the local ATD 201 is described with reference to FIG. 13. The local ATD 201 is constituted by a plurality of inverters, a delay means 207, the power source voltage detecting means 1 and transfer gates 211 and 212. The delay means 207 has a configuration shown in FIG. 14. The configuration of the delay means 207 of FIG. 14 is similar to that of the delay means 2 of FIG. 2 but connecting position of the inverter 5b in the delay means 207 is different from that of the delay means 2. Namely, an output node A3 of the power source voltage detecting means 1 is directly connected to a gate of the PMOS transistor of the first transfer gate 8 and a gate of the NMOS transistor of the second transfer gate 9 and is connected, through the inverter 5b, to a gate of the NMOS transistor of the first transfer gate 8 and a gate of the PMOS transistor of the second transfer gate 9. Due to this difference in connecting position of the inverter 5b between the delay means 207 and the delay means 2, the first and second delay portions 6 and 7 are selected when the power source voltage is low and high, respectively. Therefore, selection of the first and second delay portions 6 and 7 in the delay means 207 is contrary to that of the delay means 2.

Figure 12:
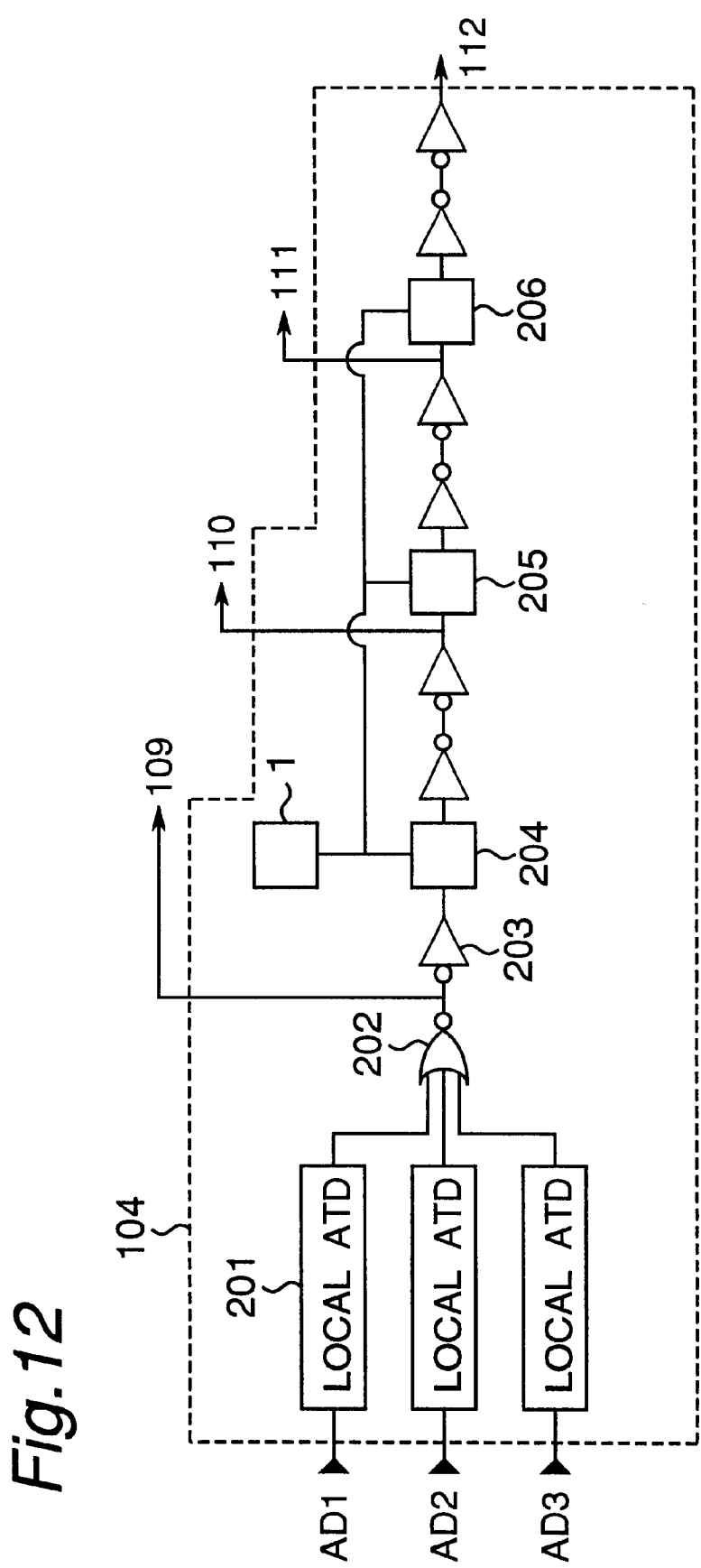
FIG. 12 is a circuit diagram of an address transition detector (ATD) employed in the SRAM of FIG. 9.
Figure 14:
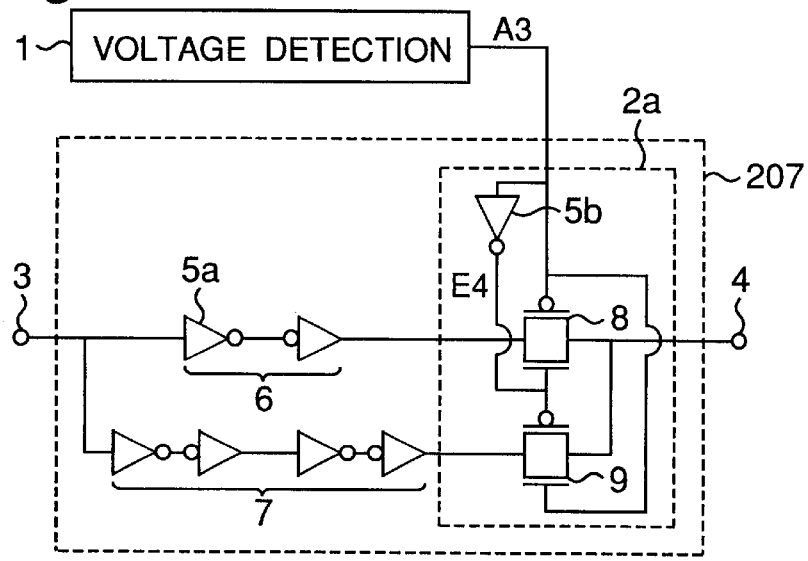
FIG. 14 is a circuit diagram of a delay means employed in the local ATD of FIG. 13.
Figure 15:
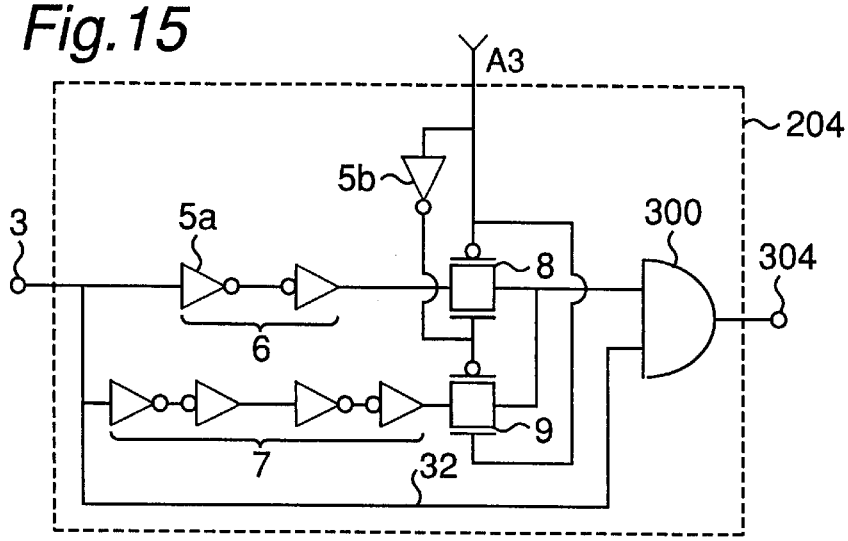
FIG. 15 is a circuit diagram of a further delay means employed in the ATD of FIG. 12.
Figure 16:
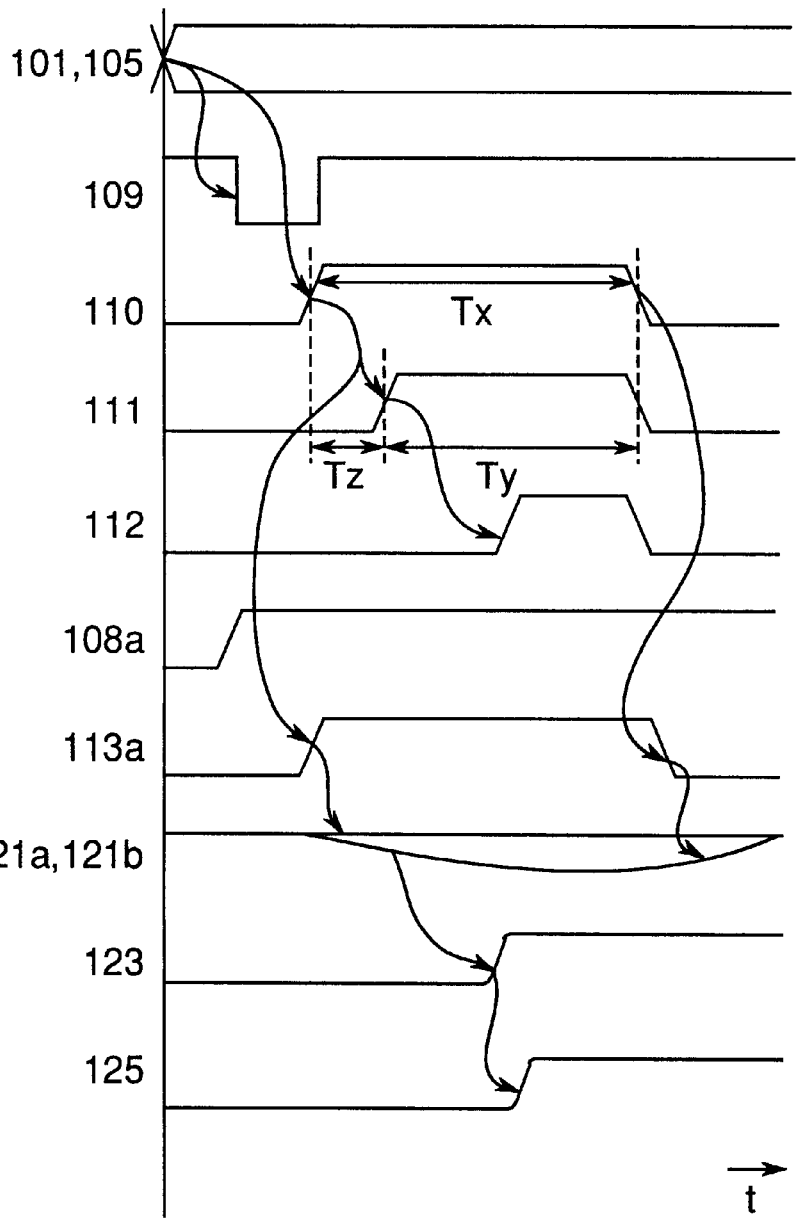
FIGS. 16A to 16J are views showing operating wave forms of the SRAM of FIG. 9.

Then, a configuration of the delay means 204 shown in FIG. 12 is described with reference to FIG. 15. The configuration of the delay means 204 of FIG. 15 is similar to that of the delay means 207 of FIG. 14 except for that in the delay means 204, the metallic line 32 is provided and an AND gate 300 having a first input end connected to output ends of the first and second transfer gates 8 and 9, a second input end connected the metallic line 32 and an output end connected to an output portion 304 of the delay means 204 is provided. In the above described configuration of the delay means 204, only a rise signal at the input portion 3 is delayed by the first or second delay portion 6 or 7 so as to determine an output of the AND gate 300. Meanwhile, a fall signal determines an output of the AND gate 300 by way of the metallic line 32 and thus, is not operatively associated with the first and second delay portions 6 and 7. Although not specifically shown, configurations of the delay means 205 and 206 are similar to that of the delay means 204 except for the numbers of the inverters 5a in the first and second delay portions 6 and 7.

Then, operation of the SRAM in this embodiment of the present invention is described. FIGS. 16A to 16J show operating wave forms of the terminals and the signal lines in the SRAM. Referring also to FIG. 9, a row address signal inputted from outside to the row address input terminal 101 as shown in FIG. 16A is delivered, through the row address buffer 102, to not only the row address decoder 103 but the ATD 104. On the other hand, a column address signal inputted from outside to the column address input terminal 105 as shown in FIG. 16A is sent, via the column address buffer 106, to not only the column address decoder 107 but the ATD 104. The column address decoder 107 selects one of the column selecting lines 108a and 108b in accordance with the column address signal. For example, in case the column selecting line 108a has been selected by the column address decoder 107, the column selecting line 108a is set to high level as shown in FIG. 16F, so that the transfer gates 119a and 119b are set in conductive state and thus, the bit lines 115a and 115b are conducted to the I/O lines 121a and 121b, respectively.

In response to transition of the row address and the column address, the ATD 104 generates the corresponding signals in the bit line equalizing signal line 109, the word line activating signal line 110, the sense amplifier activating signal line 111 and the latch signal line 112 as described above. Timing of the signals of these signal lines is shown in FIGS. 16B to 16E. In response to transition of the row address and the column address, the bit line equalizing signal corresponding to FIG. 16B is initially set to low level and then, the word line activating signal corresponding to FIG. 16C is set to high level. The sense amplifier activating signal corresponding to FIG. 16D is set to high level in response to rise of the word line activating signal and the latch signal corresponding to FIG. 16E is set to high level in response to rise of the sense amplifier activating signal.

A pair of the bit lines 115a and 115b which are connected to the memory cells 114a and 114c and a pair of the bit lines 116a and 116b which are connected to the memory cells 114b and 114d are preliminarily charged to the power source voltage by the bit line loads 117a and 117b and the bit line loads 118a and 118b, respectively. When the bit line equalizing signal corresponding to FIG. 16B has been set to low level, the bit line equalizers 117c and 118c are conducted to each other and electric current flows such that the bit lines 115a and 115b and the bit lines 116a and 116b have identical potentials, respectively. During a period determined by the word line activating signal corresponding to FIG. 16C, the row address decoder 103 selects one of the word lines 113a and 113b, which corresponds to the row address signal of FIG. 16A. For example, in case the word line 113a has been selected by the row address decoder 103, the word line 113a is set to high level as shown in FIG. 16G and thus, the memory cells 114a and 114b are activated.

Supposing that the memory cell is activated and high-level data and low-level data are, respectively, delivered to the bit lines 115a and 115b by the memory cell, these data are, respectively, transmitted to the I/O lines 121a and 121b via the transfer gates 119a and 119b as shown in FIG. 16H. These data are inputted to the sense amplifier 122 in FIG. 9, more specifically, to the gates of the NMOS transistors 173 and 174 of the current mirror 170 in FIG. 10. When the sense amplifier activating signal has been set to high level as shown in FIG. 16D, potential of the I/O line 121b is lower than that of the I/O line 121a in FIG. 10, so that quantity of current flowing through the NMOS transistor 174 is small and thus, the output node D1 of the current mirror 170 is set to high level. As a result, an input of the clocked inverter 180 is set to low level and the read data bus 123 acting as an output of the clocked inverter 180 is set to high level as shown in FIG. 16I. Subsequently, data is sent from the output buffer 124 to an output terminal 125 in FIG. 9 and the data at the output terminal 125 is at high level as shown in FIG. 16J.

Meanwhile, when the latch signal outputted from the ATD 104 as shown in FIG. 16E has been set to high level, the output latch 126 latches data of the read data bus 123. Namely, when the latch signal of the latch signal line 112 has been set to high level in the output latch 126 shown in FIG. 11, the transfer gate 191 is set in conductive state. At this time, since the read data bus 123 is at high level as shown in FIG. 16I, outputs of the inverters 193, 194 and 195 are set to low level, high level and high level, respectively. This state is maintained after the transfer gate 191 has been set in nonconductive state upon change of the latch signal of FIG. 16E to low level. Upon completion of latching operation, the latch signal is set to low level. Subsequently, the sense amplifier activating signal corresponding to FIG. 16D and the word line activating signal corresponding to FIG. 16C are set to low level and thus, read-out operation is completed.

Figure 13:
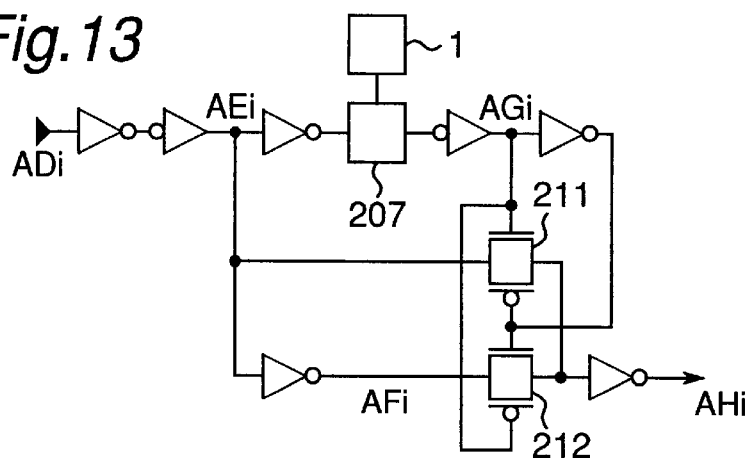
FIG. 13 is a circuit diagram of a local ATD employed in the ATD of FIG. 12.
Figure 17:
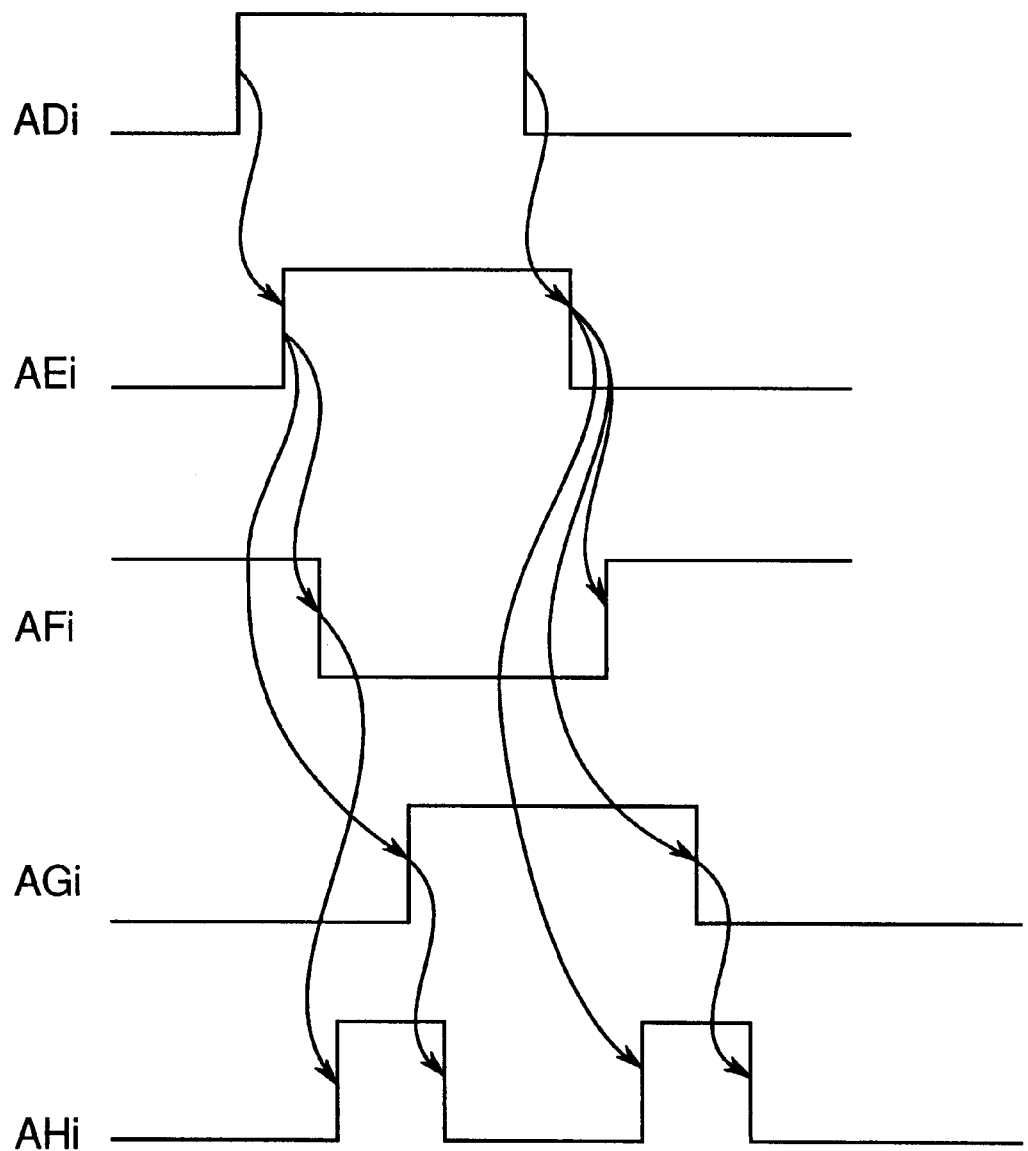
FIG. 17 is a view showing wave forms of the local ATD of FIG. 13.

Hereinafter, operation of the local ATD 201 shown in FIG. 13 is described. FIG. 17 shows operating wave forms of nodes ADi to AHi of the local ATD 201. The node ADi is connected to a signal line from the row address buffer 102 or the column address buffer 106 and carries a signal changing from low level to high level or vice versa. Initially, a case in which potential of the node ADi changes from low level to high level is described. In response to change of potential of the node ADi from low level to high level, potential of the node AFi changes from high level to low level. This change of potential of the node AFi is delivered, via the transfer gate 212, to the node AHi and thus, potential of the node AHi changes from low level to high level. Subsequently, a signal on the node AE1 is transmitted to the node AG1 with a delay caused by the delay means 207 and thus, potential of the node AG1 changes from low level to high level. As a result, since an operative transfer gate is switched from the transfer gate 212 to the transfer gate 211, data on the node AE1 is delivered, through the transfer gate 211, to the node AHi, so that potential of the node AHi changes from high level to low level such that a pulse signal is produced.

Then, a case in which potential of the ADi changes from high level to low level is described. In response to change of potential of the ADi from high level to low level, potential of the node AE1 changes from high level to low level. This change of potential of the node AE1 is delivered, via the transfer gate 211, to the node AHi and thus, potential of the node AHi changes from low level to high level. Subsequently, a signal on the node AE1 is transmitted to the node AG1 with a delay caused by the delay means 207 and thus, potential of the n ode AG1 changes from high level to low level. As a result, since an operative transfer gate is switched from the transfer gate 211 to the transfer gate 212, data on the node AF1 is delivered, through the transfer gate 212, to the node AHi, so that potential of the node AHi changes from high level to low level such that a pulse signal is produced.

Then, operation of the delay means 207 which is shown in FIG. 14 and is employed in the local ATD 201 of FIG. 13 is described mainly with regard to its differences from the delay means 2 of FIG. 2. The delay means 207 is operated substantially in the same manner as the delay means 2 of FIG. 2. However, since connecting position of the inverter 5b in the delay means 207 is different from that of the delay means 2, selection of the first and second delay portions 6 and 7 in the delay means 207 is different from that of the delay means 2. Namely, when the power source voltage is low, the node A3 is at low level, so that the first transfer gate 8 is in conductive state and thus, the first delay portion 6 having a small delay amount is selected. On the other hand, when the power source voltage is high, the node A3 is at high level, so that the second transfer gate 9 is in conductive state and thus, the second delay portion 7 having a large delay amount is selected. Therefore, when the power source voltage is low, the line having the small delay amount is selected in the delay means 7 as described above.

Then, operation of the delay means 204 which is shown in FIG. 15 and is employed in the ATD 104 of FIG. 12 is described with regard to its differences from the delay means 207 of FIG. 14. FIGS. 18A to 18C show operating wave forms of the delay means 204 and 207. FIG. 18A shows a signal at the input portion 3 of the delay means 204 and 207, FIG. 18B shows a signal at the output portion 4 of the delay means 207 and FIG. 18C shows signal at the output portion 304 of the delay means 204. In the delay means 207, when the signal at the input portion 3 changes not only from low level to high level but from high level to low level, the signal at the output portion 4 is outputted with a delay as shown in FIGS. 18A and 18B. Meanwhile, in the delay means 204, when the signal at the input portion 3 changes from low level to high level, the signal at the output portion 304 is outputted with a delay as shown in FIGS. 18A and 18C. However, in the delay means 204, when the signal at the input portion 3 changes from high level to low level, the signal at the output portion 304 is outputted substantially without being delayed as shown in FIGS. 18A and 18C. This operation of the delay means 204 is based on function of the metallic line 32 and the AND gate 300 in FIG. 15. Namely, in the delay means 204, only the rise input signal is delayed. Meanwhile, the delay means 204 and 207 are identical with each other in that the line having the small delay amount is selected when the power source voltage is low. Moreover, except for the numbers of the inverters 5a in the first and second delay portions 6 and 7, the delay means 205 and 206 shown in FIG. 12 are similar to the delay means 204 in that only the rise input signal is delayed and the line having the small delay amount is selected when the power source voltage is low.

By the above described arrangement of this embodiment of the present invention in which the delay circuit is applied to the SRAM, the following several effects can be gained. Initially, since the ATD 104 is constituted by a plurality of the delay means, the output signals suitable for the respective controls can be fetched from the delay means properly. Namely, the pulse signals are generated by the local ATDs 201 shown in FIG. 12 and the control signals, i.e., the bit line equalizing signal, the word line activating signal, the sense amplifier activating signal and the latch signal are produced on the basis of the pulse signals through the respective delay means so as to be outputted as signals suitable for the respective operations.

Furthermore, by using the delay means 204 of FIG. 15 and the delay means 207 of FIG. 14, in which the delay portion having the small delay amount is selected when the power source voltage is small, it is possible to solve also the following problem specific to an arrangement in which a plurality of the delay means are connected to one another in series. Conventionally, a fixed delay circuit shown in FIG. 24 has been employed in place of the delay means 204 to 206 in FIG. 12 and the delay means 207 in FIG. 14. Thus, in low-voltage operation, switch between the transfer gates 211 and 212 in FIG. 13 is delayed greatly and pulse width of the local ATD 201 increases largely. Furthermore, since the respective control signals are produced on the basis of the greatly delayed ATD pulse and the delay means 204 to 207 themselves, which have the configuration of FIG. 24 in prior art, are also delayed greatly, delay is multiplied. As a result, conventionally, in low-voltage operation, read-out can be performed but access time is delayed largely by delay of completion of bit line equalizing and start of operation of the sense amplifier 122 due to great delay of the respective control signals.

Therefore, in case a signal fed through a plurality of the delay means is used as the control signal in low-voltage operation, it is necessary for rapid access to employ an arrangement in which delay amount does not increase highly. Accordingly, in this embodiment of the present invention, since the delay means in which the delay portion having the less delay amount is selected in low-voltage operation is used in the control signal generating circuit, large delay is not produced in the control signal.

Meanwhile, in this embodiment of the present invention, also in the arrangement in which only the rise input signal is delayed as shown in FIG. 15, the delay means in which the delay portion having the less delay amount is selected when the power source voltage drops is employed, the following advantages can be achieved. The word line activating signal and the sense amplifier activating signal are described by way of example. It is supposed here that "Tx" in FIG. 16C denotes a pulse width of the word line activating signal and "Ty" and "Tz" in FIG. 16D denote a pulse width of the sense amplifier activating signal and a delay amount from rise of the word line activating signal to rise of the sense amplifier activating signal, respectively. Since the delay means of FIG. 15 delays only rise of the input signal, a sum of the pulse width Ty of the sense amplifier activating signal and the delay amount Tz is substantially equal to the pulse width Tx of the word line activating signal.

Figure 24:
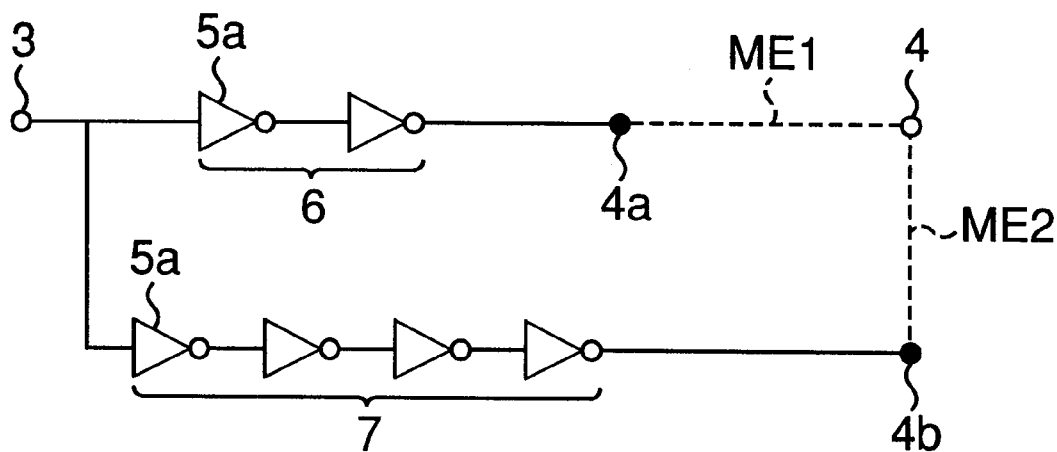
FIG. 24 is a circuit diagram of a prior art delay circuit.

On the contrary, in case the conventional delay circuit of FIG. 24 is used for the delay means 204 or 205 in FIG. 12, delay amount increases at low voltage, so that rise of the word line activating signal of FIG. 16C on the word line activating signal line 110 in FIG. 12 is delayed and thus, the pulse width Tx of the word line activating signal decreases. Meanwhile, since rise of the sense amplifier activating signal of FIG. 16D on the sense amplifier activating signal line 111 in FIG. 12 is also delayed, the delay amount Tz increases and the pulse width Ty of the sense amplifier activating signal decreases. As a result, since word line activating period becomes short, there is a possibility that data of the memory cells is not transmitted to the bit lines sufficiently. Meanwhile, since sense amplifier activating period becomes short, erroneous read-out may happen if sense amplifier activation is finished prior to completion of sense operation. Therefore, the delay amount Tz should not be made quite large and the pulse widths Tx and Ty should not be made narrow. To this end, it is proper that the delay means 204 or 205 in which the small delay amount is selected at low voltage as shown in FIG. 15 is used for the ATD 104 in this embodiment of the present invention.

Moreover, in FIG. 15, rise of the input signal is delayed. However, in case the AND gate 300, for example, is replaced by an OR gate, fall of the input signal can be delayed. By employing the delay means in which the delay portion having the less delay amount is selected in low-voltage operation also when the OR gate is used, large delay of operation can be eliminated and the pulse widths can be kept constant.

In this embodiment, the present invention is applied to the SRAM but may also be applied to other semiconductor memory units such as a dynamic random access memory (DRAM) and a flash memory. Meanwhile, in this embodiment of the present invention, read-out operation is described as one example but writing operation can also be performed. Furthermore, this embodiment of the present invention may also be applied to other semiconductor devices each having a plurality of the delay means.

Meanwhile, in this embodiment of the present invention, the circuit for reducing delay amount at low voltage is employed in each delay means but may not necessarily used in all the delay means so as to be properly combined with the delay means of FIG. 2 in conformity with timing.

Moreover, since the power source voltage detecting means 1 is provided in common for the delay means 204 to 206, changeover of the delay portions can be performed at the same power source voltage in the respective delay means, so that the delay amounts can be controlled easily. In addition, since the power source voltage detecting means 1 is provided in common for the delay means 204 to 206, the number of the power source voltage detecting means 1 is reduced to one, so that an area occupied by the power source voltage detecting means 1 can be reduced in the semiconductor device. However, in the case where it is difficult to perform wiring or it is necessary to control the respective delay means at different voltages because the delay means are distant away from each other, the power source voltage detecting means 1 may be provided for each delay means.

In addition, in this embodiment of the present invention, the bit line equalizing signal has been described but control of the I/O lines 121a and 121b acting as data lines in the same manner as the bit lines may be likewise performed by the ATD 104 by using an equalizer and an equalizing signal so as to be effective for high-speed operation at low voltage.

(Seventh Embodiment)

Figure 20:
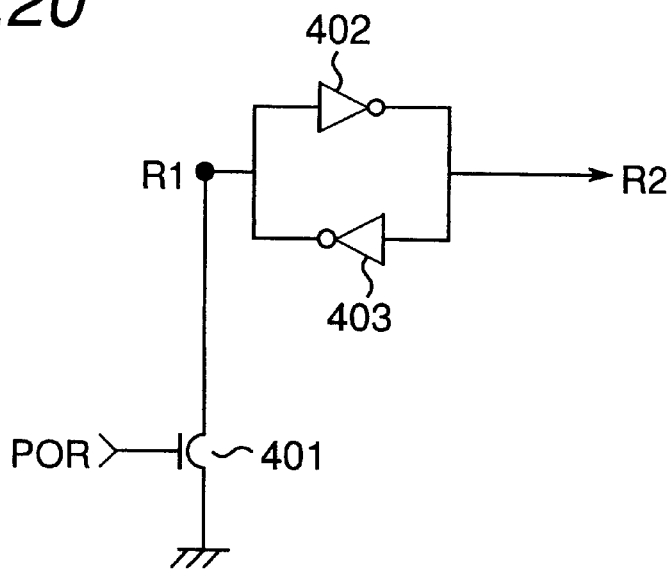
FIG. 20 is a circuit diagram of a power on reset latch circuit connected to the power source voltage detecting means of FIG. 19.
Figure 21:
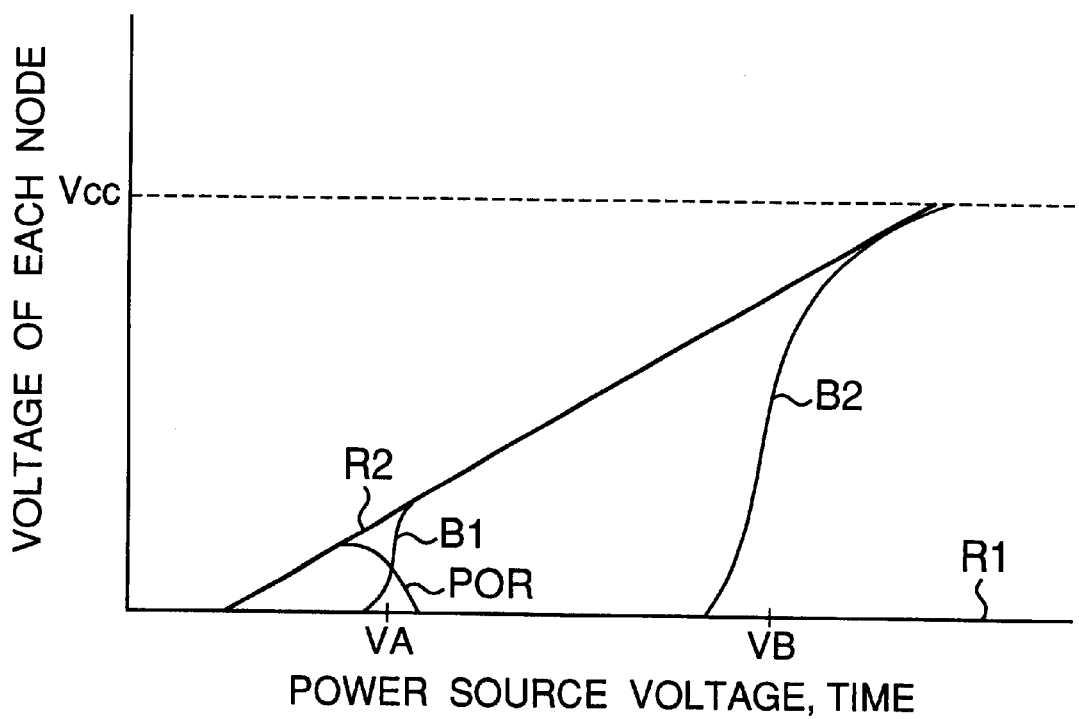
FIG. 21 is a graph showing voltage characteristics of the power source voltage detecting means of FIG. 19.

FIGS. 19 to 21 show a seventh embodiment of the present invention, in which an output of the power source voltage detecting means 1 is used for power on reset (POR) for initializing a semiconductor device at the time of turning on of the power source. A circuit configuration of FIG. 19 is similar to that of FIG. 7 except for that in FIG. 19, an inverter 5c is connected to the output node B1 of the first power source detecting circuit 41 and an output of the inverter 5c is connected to a node POR.

FIG. 20 shows a latch circuit to which the node POR is connected. In FIG. 20, the node POR is connected to a gate of an NMOS transistor 401 and a latch having a latch input portion R1 and a latch output portion R2 is constituted by inverters 402 and 403. The latch input portion R1 is connected to a drain of the NMOS transistor 401.

Then, operation in which the power source voltage rises to the voltage Vcc with time after turning on of the power source is described. FIG. 21 shows changes of voltages of the nodes B1, B2, POR, R1 and R2 in the case of change of the power source voltage with time. In FIG. 21, the output node B1 of the first power source voltage detecting circuit 41 changes from low level to high level at a voltage VA, while the output node B2 of the second power source voltage detecting circuit 42 changes from low level to high level at a voltage VB higher than the voltage VA. In FIG. 21, when the power source voltage ranges from 0 to less than the voltage VA, the nodes B1 and B2 are at low level and the node POR is at high level such that the voltage of the node POR rises in accordance with the power source voltage.

Therefore, when the NMOS transistor 401 of FIG. 20 exceeds its threshold voltage, the NMOS transistor 401 is set in conductive state, so that the latch input portion R1 is at low level and the latch output portion R2 is at high level.

Subsequently, when the power source voltage ranges from the voltage VA to less than the voltage VB, the node B1 is at high level, the node POR is at low level and the node B2 is kept at low level. As a result, the latch output portion R2 is fixed, as an initial value, at high level. Furthermore, when the power source voltage is not less than the voltage VB, the node B2 is also set to high level.

As described above, by using an output of the power source voltage detecting means 1, power on reset operation for initializing the semiconductor device at the time of turning on of the power source, namely, setting of the latch output portion R2 to high level can be performed. By using the power source voltage detecting means 1 for both the delay means and power on reset as described above, a power source voltage detecting means is not required to be additionally provided for power on reset.

In this embodiment of the present invention, a voltage detection signal of the first power source voltage detecting circuit 41 operating at low voltage is used as a power on reset signal but an output signal of the second power source voltage detecting circuit 42 operating at high voltage may be used as the power on reset signal in dependence of conditions of the semiconductor device so as to perform power on reset or resetting operation conforming to the power source voltage.

However, even if the semiconductor device is operated at high voltage, voltage of the semiconductor device should pass through low voltage while rising from 0V to high voltage upon turning on of the power source. Therefore, the first power source voltage detecting circuit 41 operating at low voltage enables ordinary power on reset operation. Accordingly, in the semiconductor device including the power source voltage detecting means capable of detecting a plurality of power source voltages, an option in which a voltage detection signal for detecting a lowest one of the power source voltages is used as the power on reset signal is preferable in that the voltage detection signal can be used for any voltage operation.

Furthermore, one of a plurality of the voltage detection signals may be used for power on reset only without being used for the delay means. Hence, power on reset can be performed at the power source voltage different from that used for changeover of the delays of the delay means.

(Eighth Embodiment)

Figure 22:
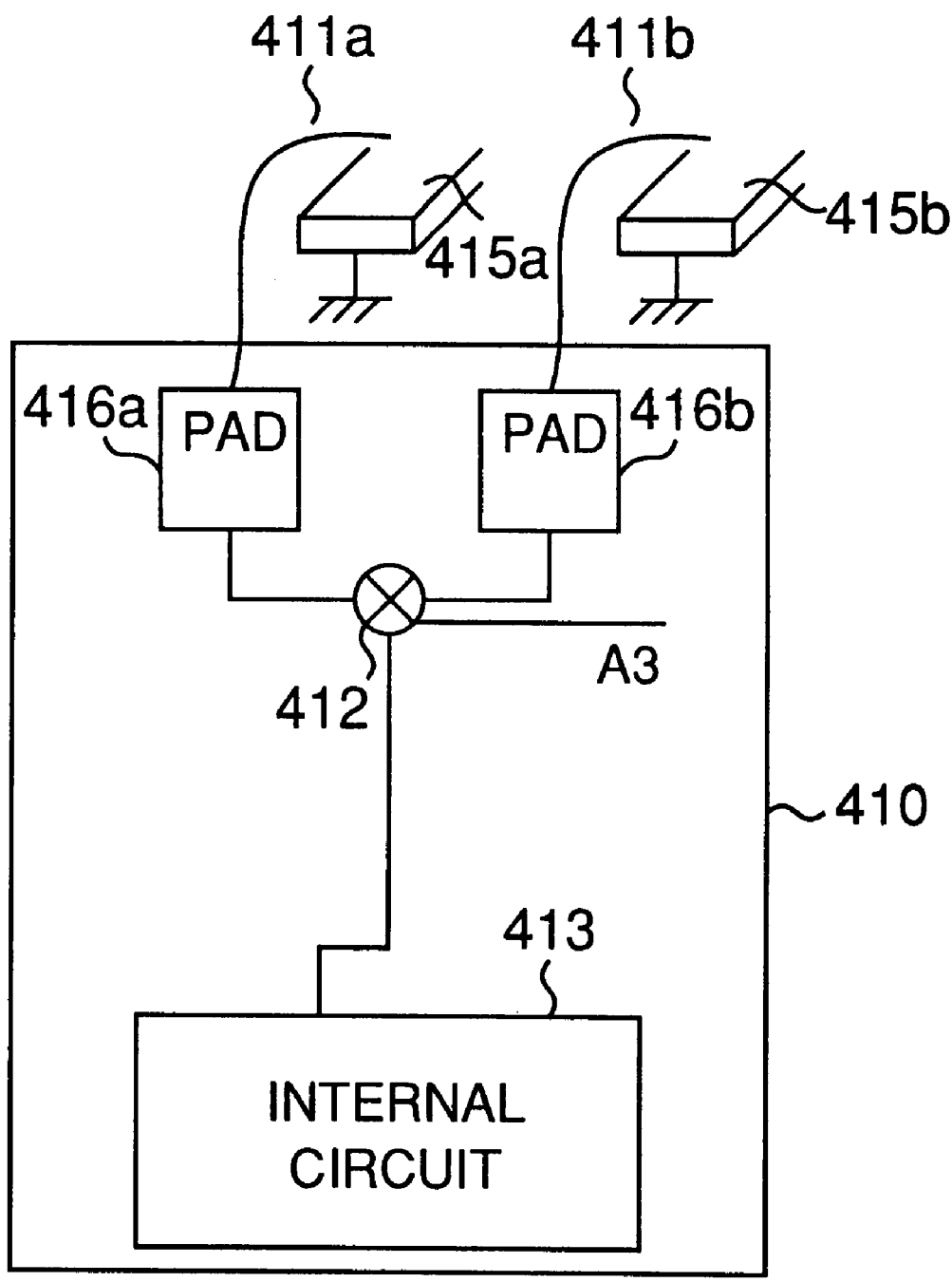
FIG. 22 is a circuit diagram of a pad switching circuit according to an eighth embodiment of the present invention.

FIG. 22 shows an eighth embodiment of the present invention, in which grounding pins connected to a semiconductor chip 410 are switched in accordance with the power source voltage. First and second inner leads 415a and 415b each acting as a grounding pin are connected to exterior of the semiconductor chip 410. A first wire 411a connects the first inner lead 415a and a first pad 416a, while a second wire 411b connects the second inner lead 415b and a second pad 416b. Each of the first and second pads 416a and 416b is connected, through a selective portion 412, to an internal circuit 413 on the semiconductor chip 410. The selective portion 412 is constituted by, for example, the first and second transfer gates 8 and 9 and the inverter 5b shown in FIG. 2. A control end of the selective portion 412 is connected to the node A3 so as to lead to, for example, the power source voltage detecting means 1 of FIG. 2.

By the above described arrangement, if the first inner lead 415a is used as a first grounding pin when the power source voltage is low, the selective portion 412 connects the first pad 416a and the internal circuit 413 on the basis of the node A3 of the power source voltage detecting means 1. Meanwhile, in case the second inner lead 415b is used as a second grounding pin when the power source voltage is high, the selective portion 412 connects the second pad 416b and the internal circuit 413 on the basis of the node A3 of the power source voltage detecting means 1.

In case the grounding pins are switched in accordance with the power source voltage, the output signal of the power source voltage detecting means 1 can be used for not only the delay means 2 but a switching signal which connects the grounding pins to the internal circuit selectively as described above.

Meanwhile, since the power source voltage detecting means 1 is used in common for the delay means 2 and switch of the first and second pads 416a and 416b, the semiconductor device can be made compact.

Furthermore, the two power source voltage detecting means 1 may also be provided so as to control the delay means 2 and switch of the first and second pads 416a and 416b at different power source voltages, respectively.

(Ninth Embodiment)

Figure 23:
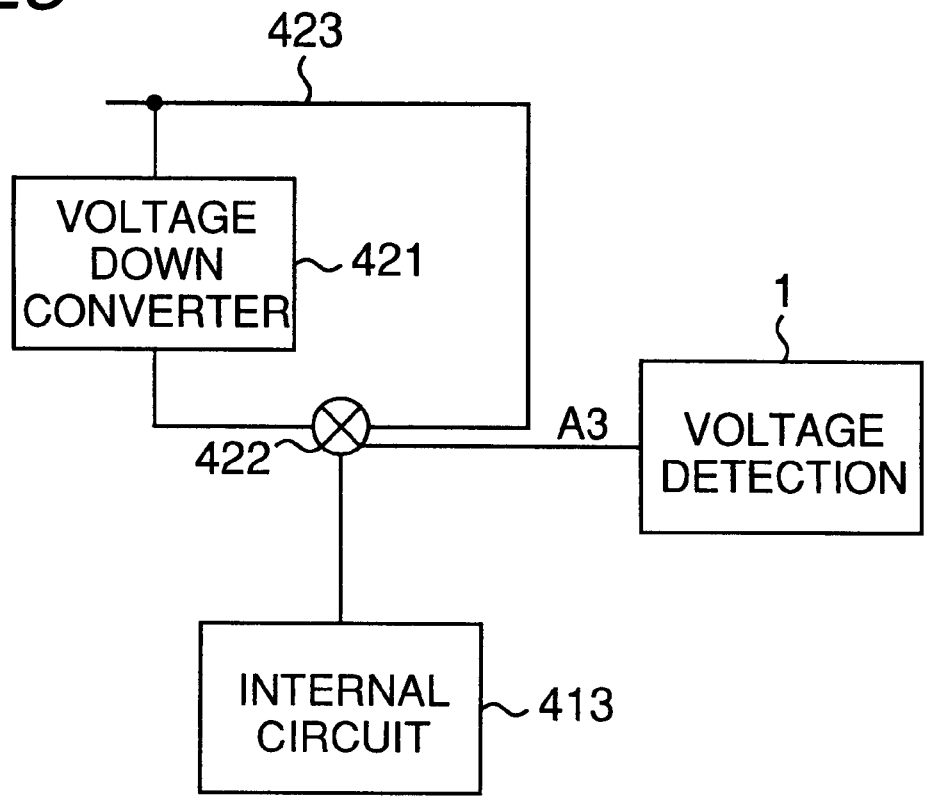
FIG. 23 is a circuit diagram of a power source voltage switching circuit according to a ninth embodiment of the present invention.

FIG. 23 shows a semiconductor device according to a ninth embodiment of the present invention, which includes an internal voltage down converter 421. The internal voltage down converter 421 is connected to the internal circuit 413 via a selective portion 422 so as to supply to the internal circuit 413 a voltage lower than the power source voltage. The internal circuit 413 is to a power source voltage line 423 through the selective portion 422. The selective portion 422 is connected to the output node A3 of the power source voltage detecting means 1. The selective portion 422 is operated so as to supply the power source voltage from the power source voltage line 423 to the internal circuit 413 directly when the power source is low and supply, by way of the internal voltage down converter 421, to the internal circuit 413 a voltage lower than the power source voltage when the power source voltage is high. The output of the power source voltage detecting means 1 may be used in common for the above mentioned switch of the power source voltage for the internal circuit 413 and the delay means 2. Meanwhile, in case the internal voltage down converter 421 and the delay means 2 have different control voltages or are spaced away from each other due to their layout, the two power source voltage detecting means 1 may be provided for the internal voltage down converter 421 and the delay means 2, respectively.

Meanwhile, a plurality of power source voltage detection signals may be outputted from the power source voltage detecting means 1 such that different signals are produced in accordance with the power source voltage.

Furthermore, by properly combining a power on reset circuit, the internal voltage down converter 421, the delay means and connection of the pads to the grounding pins, the power source voltage detecting means 1 may be provided in common for these circuits or may be provided for each of these circuits so as to control these circuits independently of one another.

In the first to ninth embodiments of the present invention, each of the constituent elements may be replaced by any other element having the same function as that of the constituent element. For example, the inverter is used as a delay element of the delay portion but may be replaced by a resistance or a capacitance or their combination. Furthermore, the number of the inverters in the delay portion is given only by way of example and thus, may be changed properly in the respective semiconductor devices.

As is clear from the foregoing description, the following marked effects (1) to (20) can be gained in the semiconductor device of the present invention.

(1) Since the semiconductor device includes the power source voltage detecting means for outputting the voltage detection signal and the delay means in which one of the delay portions is selected in accordance with the voltage detection signal, the delay amount suitable for the power source voltage can be selected.

(2) Since the selective portion is provided between the delay portions and the output portion of the delay means, input of the inverters of the delay portions does not become indeterminate.

(3) Since the power source voltage detecting means includes the PMOS transistor and the resistance element, the power source voltage detecting means can be made compact.

(4) Since the selective portion includes the clocked inverter and the clocked inverter has delay amount similar to that of the inverter, delay amount can be set easily.

(5) Since the metallic line is used as the delay portion, the metallic line can be used for minute adjustment of delay amount more easily than the delay element.

(6) Since the common delay portion is provided, the number of the delay elements of the delay portion can be reduced and thus, the delay means can be made compact.

(7) Since the power source voltage detecting means outputs a plurality of the voltage detection signals in accordance with a plurality of, e.g., not less than three power source voltages and the delay means selects one of the delay portions in accordance with the voltage detection signals, delay amount suitable for each power source voltage can be selected properly.

(8) Since the first delay portions and the second delay portions are provided in series, not less than three power source voltages can be handled without the need for forming a complicated logic circuit.

(9) Since a plurality of the delay means are connected to each other in series, the output signal can be properly taken out of each delay means and thus, a signal suitable for each control can be used.

(10) Since the delay amount of the delay portion selected by the delay means at the time the power source voltage is less than the predetermined voltage is smaller than those obtained at the time the power source voltage is not less than the predetermined voltage, it is possible to prevent great delay when the power source voltage is less than the predetermined voltage.

(11) Since delay amount can be changed by the power source voltage, the pulse signal acting as the input signal can secure a predetermined pulse width of a delay signal without incurring disruption of its shape.

(12) Since delay amount can be changed by the power source voltage, delay amount of a rise input signal is different from that of a fall input signal, so that delay amount can be adjusted properly in accordance with the rise input signal and the fall input signal.

(13) Since the ATD includes the power source voltage detecting means and the delay means, the ATD can produce an output corresponding to the power source voltage.

(14) Since the delay signal of the delay means is used as the control signal or the activation signal, it is possible to perform read-out corresponding to the power source.

(15) Since the power source voltage detecting means is provided for a plurality of the delay means in common, each delay means can switch the delay portion at an identical power source voltage.

(16) Since the power source voltage detecting means is used in common for power on reset and the delay means, the power source voltage detecting means can be made compact.

(17) Since the voltage detection signal used as the initialization signal and the voltage detection signal inputted to the delay means correspond to different power source voltages, respectively, power on reset and the delay means can be actuated at the proper power source voltages, respectively.

(18) Since the voltage detection signal corresponding to the lowest one of the power source voltages is used for power on reset, power on reset can be performed if the power source voltage is not less than the lowest one of the power source voltages.

(19) Since the power source voltage detecting means is used in common for the pad selection circuit and the delay means, the power source voltage detecting means can be made compact.

(20) Since the power source voltage detecting means is used in common for the power source voltage switching circuit and the delay means, the power source voltage detecting means can be made compact.

What is claimed is:

1. A semiconductor device comprising:
   a power source voltage detecting means for outputting a voltage detection signal in accordance with a power source voltage; and
   a delay means which includes an input portion for receiving an input signal, a plurality of delay portions connected to the input portion, a selective portion for selecting one of the delay portions in accordance with the voltage detection signal and an output portion for outputting a delay signal obtained by delaying the input signal by the one of the delay portions.

2. A semiconductor device according to claim 1, wherein the selective portion includes an input end connected to the delay portions, an output end connected to the output portion of the delay means and a control end for receiving the voltage detection signal.

3. A semiconductor device according to claim 1, wherein the power source voltage detecting means includes a PMOS transistor and a resistance element having one end connected to a drain and a gate of the PMOS transistor and the other end connected to a grounding conductor;
   wherein a source of the PMOS transistor is connected to a power source voltage line and the drain and the gate of the PMOS transistor are connected to each other such that a voltage at a common junction of the drain, the gate and the resistance element is used as the voltage detection signal.

4. A semiconductor device according to claim 1, wherein the selective portion includes a clocked inverter.

5. A semiconductor device according to claim 1, wherein at least one of the delay portions is formed by a metallic line.

6. A semiconductor device according to claim 1, wherein the delay means includes first and second delay portions connected to each other in parallel and a third delay portion connected to the first and second delay portions in series.

7. A semiconductor device according to claim 1, wherein the power source voltage detecting means outputs a plurality of voltage detection signals in accordance with a plurality of power source voltages and the selective portion of the delay means selects one of the delay portions in accordance with the voltage detection signals.

8. A semiconductor device according to claim 7, wherein the delay means includes first and second delay portions connected to each other in parallel, a first selective portion connected to the first and second delay portions so as to select one of the first and second delay portions in accordance with a first voltage detection signal, third and fourth delay portions connected to each other in parallel so as to receive a delay signal transmitted from the first selective portion and a second selective portion connected to the third and fourth delay portions so as to select one of the third and fourth delay portions in accordance with a second voltage detection signal corresponding to a power source voltage different from that of the first voltage detection signal.

9. A semiconductor device according to claim 1, wherein first and second delay means connected to each other in series and first and second circuits for receiving first and second delay signals of the first and second delay means, respectively are provided such that the first delay signal of the first delay means is used as an input signal of the second delay means.

10. A semiconductor device according to claim 1, wherein a delay amount of the one of the delay portions selected by the delay means at the time the power source voltage is less than a predetermined voltage is smaller than those obtained at the time the power source voltage is not less than the predetermined voltage.

11. A semiconductor device according to claim 1, wherein the input signal of the delay means is a pulse signal.

12. A semiconductor device according to claim 1, wherein a delay amount of a delay signal outputted by the delay means in response to a rise input signal is different from that of a delay signal outputted by the delay means in response to a fall input signal.

13. A semiconductor device according to claim 1, further comprising:
    a plurality of memory cells; and
    an address transition detector which includes the power source voltage detecting means and the delay means;
    wherein an address signal for selecting one of the memory cells is used as the input signal of the delay means and the delay signal of the delay means is used as an output signal of the address transition detector.

14. A semiconductor device according to claim 13, wherein the output signal of the address transition detector is used as one of a signal for setting in a selective state for a predetermined period a word line to be selected by the address signal, a signal for controlling so as to equalize potentials of a pair of data lines for receiving data from the memory cells connected to the word line, a signal for activating a sense amplifier for amplifying data from the data lines and a signal for controlling a latch circuit for latching data of a read data bus for receiving an output of the sense amplifier.

15. A semiconductor device according to claim 1, wherein a plurality of delay means are provided and an output of the power source voltage detecting means is inputted to some of the delay means in common.

16. A semiconductor device according to claim 1, further comprising:
    a circuit for setting, at the time of turning on of a power source, a node on a predetermined circuit to an initial value by an initialization signal;
    wherein the voltage detection signal is used as the initialization signal.

17. A semiconductor device according to claim 16, wherein the voltage detection signal used as the initialization signal and the voltage detection signal inputted to the delay means correspond to different power source voltages, respectively.

18. A semiconductor device according to claim 7, further comprising:
    a circuit for setting, at the time of turning on of a power source, a node on a predetermined circuit to an initial value by an initialization signal;
    wherein one of the voltage detection signals corresponds to a lowest one of the power source voltages and is used as the initialization signal.

19. A semiconductor device according to claim 1, further comprising:
    first and second pads which are connected to a ground potential; and
    an internal circuit which is connected to the first and second pads through the selective portion;
    wherein the selective portion selectively connects one of the first and second pads to the internal circuit in accordance with the voltage detection signal.

20. A semiconductor device according to claim 1, further comprising:
   an internal voltage down converter which is directly connected to a power source line for receiving the power source voltage and outputs a voltage lower than the power source voltage;
   wherein the selective portion selectively connects one of an output of the internal voltage down converter and the power source line to the internal circuit in accordance with the voltage detection signal.

* * * * *